(12) United States Patent
Kim et al.

(10) Patent No.: US 11,574,948 B2
(45) Date of Patent: Feb. 7, 2023

(54) IMAGE SENSOR INCLUDING TRANSFER TRANSISTOR HAVING CHANNEL PATTERN ON INTERLAYERED INSULATING LAYER OVER SUBSTRATE AND METHOD OF FABRICATING AN IMAGE SENSOR

(71) Applicant: SAMSUNG ELECTRONICS CO., LTD., Suwon-si (KR)

(72) Inventors: Changhwa Kim, Suwon-si (KR); Kwansik Kim, Suwon-si (KR); Dongchan Kim, Suwon-si (KR); Sang-Su Park, Suwon-si (KR); Beomsuk Lee, Suwon-si (KR); Taeyon Lee, Suwon-si (KR); Hajin Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/711,301

(22) Filed: Dec. 11, 2019

(65) Prior Publication Data
US 2020/0381473 A1  Dec. 3, 2020

(30) Foreign Application Priority Data
May 30, 2019  (KR) ........................ 10-2019-0063945

(51) Int. Cl.
*H01L 27/146* (2006.01)
*H01L 51/44* (2006.01)
*H01L 29/786* (2006.01)

(52) U.S. Cl.
CPC .... *H01L 27/14645* (2013.01); *H01L 27/1464* (2013.01); *H01L 27/14616* (2013.01);
(Continued)

(58) Field of Classification Search
CPC .......... H01L 27/14643; H01L 29/7869; H01L 27/1225; H01L 27/14636; H01L 27/14616;
(Continued)

(56) References Cited

U.S. PATENT DOCUMENTS 8,476,703 B2   7/2013  Wang
9,159,749 B2  10/2015  Wang
(Continued)

FOREIGN PATENT DOCUMENTS

KR   1020200040516 A   4/2020
KR   1020200085983 A   7/2020

*Primary Examiner* — David Chen
(74) *Attorney, Agent, or Firm* — Volentine, Whitt & Francos, PLLC

(57) ABSTRACT

An image sensor and a method of fabricating the image sensor, the image sensor including a semiconductor substrate having a first floating diffusion region, a molding pattern over the first floating diffusion region and including an opening, a first photoelectric conversion part at a surface of the semiconductor substrate, and a first transfer transistor connecting the first photoelectric conversion part to the first floating diffusion region. The first transfer transistor includes a channel pattern in the opening and a first transfer gate electrode. The channel pattern includes an oxide semiconductor. The channel pattern also includes a sidewall portion that covers a side surface of the opening, and a center portion that extends from the sidewall portion to a region over the first transfer gate electrode.

19 Claims, 26 Drawing Sheets

(52) U.S. Cl.
CPC .. *H01L 27/14621* (2013.01); *H01L 27/14643* (2013.01); *H01L 29/7869* (2013.01); *H01L 51/442* (2013.01)

(58) Field of Classification Search
CPC ........... H01L 27/1464; H01L 27/14612; H01L 27/14621; H01L 27/307; H01L 27/14645; H01L 27/1469; H01L 51/442
USPC ..... 257/43, 431, E27.13, E27.133, E31.127; 438/70, 104, 158, 432, 443
See application file for complete search history.

(56) References Cited

U.S. PATENT DOCUMENTS

| | | |
|---|---|---|
| 9,196,648 B2 | 11/2015 | Kozuma et al. |
| 9,601,631 B2 | 3/2017 | Godo |
| 9,748,291 B2 | 8/2017 | Ikeda et al. |
| 10,014,413 B2 | 7/2018 | Yamazaki et al. |
| 10,026,849 B2 | 7/2018 | Clevenger et al. |
| 2011/0019042 A1* | 1/2011 | Yamaguchi ........... H01L 27/307 348/280 |
| 2011/0127523 A1* | 6/2011 | Yamazaki ............... H01L 29/04 257/E29.296 |
| 2011/0254037 A1* | 10/2011 | Arasawa ............. H01L 51/5284 257/98 |
| 2012/0319102 A1* | 12/2012 | Yamazaki ......... H01L 29/66969 257/43 |
| 2013/0285046 A1* | 10/2013 | Yamazaki ......... H01L 27/14603 257/43 |
| 2015/0255498 A1* | 9/2015 | Sugiura ............ H01L 27/14623 257/432 |
| 2015/0311245 A1* | 10/2015 | Yamazaki ......... H01L 27/14643 257/43 |
| 2015/0349129 A1* | 12/2015 | Ikeda .................... H01L 29/786 257/43 |
| 2017/0277356 A1* | 9/2017 | Hsieh ...................... G06F 3/042 |
| 2018/0226444 A1 | 8/2018 | Togashi et al. |
| 2020/0119097 A1 | 4/2020 | Lee et al. |
| 2020/0243608 A1* | 7/2020 | Jeon .................. H01L 27/14627 |

* cited by examiner

IMAGE SENSOR INCLUDING TRANSFER TRANSISTOR HAVING CHANNEL PATTERN ON INTERLAYERED INSULATING LAYER OVER SUBSTRATE AND METHOD OF FABRICATING AN IMAGE SENSOR

CROSS-REFERENCE TO RELATED APPLICATIONS

A claim for priority under 35 U.S.C. § 119 is made to Korean Patent Application No. 10-2019-0063945, filed on May 30, 2019, in the Korean Intellectual Property Office, the entire contents of which are hereby incorporated by reference.

BACKGROUND OF THE INVENTION

The present inventive concepts relate to image sensors and methods of fabricating image sensors.

Image sensors are semiconductor devices configured to convert optical images into electrical signals. Image sensors may be generally classified into two types: charge coupled device (CCD) type and complementary metal-oxide-semiconductor (CMOS) type. In general, a CMOS-type image sensor may be referred to as a "CIS". A CIS includes a plurality of two-dimensionally arranged pixels, each of which includes a photodiode (PD) that converts incident light into an electrical signal.

SUMMARY

Embodiments of the inventive concepts provide a method capable of reducing a size of a transistor and suppressing contamination by an oxide semiconductor material when an image sensor is fabricated.

Embodiments of the inventive concepts provide a highly integrated image sensor configured to have reduced noise properties and improved image quality.

Embodiments of the inventive concepts provide an image sensor including a semiconductor substrate including a first floating diffusion region; a molding pattern over the first floating diffusion region and including an opening; a first photoelectric conversion part at a surface of the semiconductor substrate; and a first transfer transistor connecting the first photoelectric conversion part to the first floating diffusion region. The first transfer transistor includes a channel pattern in the opening, and a first transfer gate electrode. The channel pattern including an oxide semiconductor. The channel pattern includes a sidewall portion that covers a side surface of the opening, and a center portion that extends from the sidewall portion to a region over the first transfer gate electrode.

Embodiment of the inventive concepts further provide an image sensor including a molding pattern on a semiconductor substrate and including an opening; a channel pattern in the opening, the channel pattern including a sidewall portion that covers a side surface of the opening, and a top surface of the channel pattern is positioned at a same level as a top surface of the molding pattern; a planarization pattern filling the opening; a gate insulating layer on the channel pattern; and a gate electrode spaced apart from the channel pattern with the gate insulating layer interposed therebetween.

Embodiments of the inventive concepts still further provide an image sensor including a semiconductor substrate including a first surface and a second surface opposite the first surface; a first floating diffusion region and a second floating diffusion region disposed on the first surface of the semiconductor substrate; a first photoelectric conversion part on the second surface; a second photoelectric conversion part disposed in the semiconductor substrate; a molding pattern on the first surface and including an opening; a planarization pattern in the opening; and a first transfer transistor connecting the first photoelectric conversion part to the first floating diffusion region. The first transfer transistor includes a channel pattern in the opening, and a first transfer gate electrode. The channel pattern including an oxide semiconductor. The channel pattern includes a sidewall portion that covers a side surface of the opening, and a center portion that extends from the sidewall portion to a region on the first transfer gate electrode.

Embodiments of the inventive concepts also provide a method of fabricating an image sensor may including forming a floating diffusion region in a surface of a semiconductor substrate; forming a first interlayered insulating layer that covers the floating diffusion region; forming a contact plug in the first interlayered insulating layer and connected to the floating diffusion region; forming a molding layer on the first interlayered insulating layer, the molding layer including an opening; forming a channel layer along side and bottom surfaces of the opening, the channel layer including an oxide semiconductor; forming an insulating layer to cover the channel layer and fill the opening; and performing a planarization process on the insulating layer to expose the molding layer.

Embodiments of the inventive concepts provide an image sensor including a semiconductor substrate having a first surface and a second surface opposite the first surface; a floating diffusion region on the first surface of the semiconductor substrate; a photoelectric conversion part on the second surface of the semiconductor substrate; a channel layer over the first surface of the substrate and disposed within an opening of a molding pattern, the channel layer having a first end connected to the photoelectric conversion part, and a second end opposite the first end, the second end connected to the floating diffusion region; and a transfer gate electrode adjacent the channel layer.

BRIEF DESCRIPTION OF THE DRAWINGS

Embodiments of the inventive concepts will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully described with reference to the accompanying drawings, in which example embodiments are shown.

It should be understood that the figures are intended to illustrate the general characteristics of methods, structure and/or materials utilized in certain example embodiments and to supplement the written description. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Figure 1:
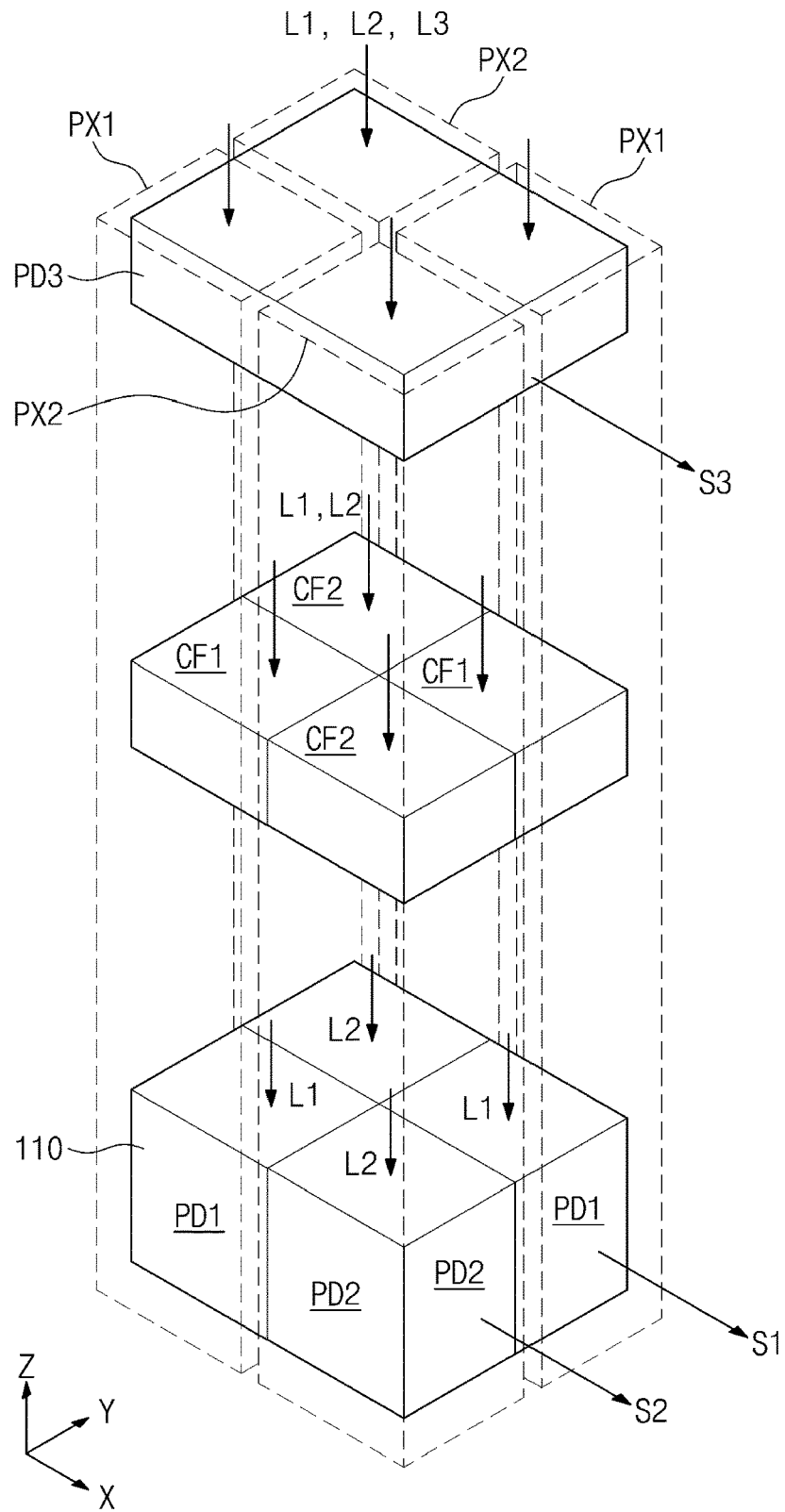
FIG. 1 illustrates a block diagram of an image sensor according to embodiments of the inventive concepts.

FIG. 1 illustrates a block diagram of an image sensor according to embodiments of the inventive concepts.

Referring to FIG. 1, an image sensor may include first to third photoelectric conversion parts PD1, PD2, and PD3 and first and second color filters CF1 and CF2. The first and second photoelectric conversion parts PD1 and PD2 may be provided in a semiconductor substrate 110. The third photoelectric conversion part PD3 may be provided on a surface of the semiconductor substrate 110, and the first and second color filters CF1 and CF2 may be provided between the third photoelectric conversion part PD3 and the semiconductor substrate 110.

Light L1, L2, and L3 of respective first to third wavelengths may be incident onto the third photoelectric conversion part PD3. The first wavelength and the second wavelength may differ from the third wavelength. The first wavelength may differ from the second wavelength. For example, the light L1 of the first wavelength may correspond to a red color light, the light L2 of the second wavelength may correspond to a blue color light, and the light L3 of the third wavelength may correspond to a green color light.

The third photoelectric conversion part PD3 may generate a third photoelectric signal S3 from the light L3 of the third wavelength. The third photoelectric conversion part PD3 may be configured to allow the light L1 and L2 of the first and second wavelengths to pass therethrough. The third photoelectric conversion part PD3 may be shared by a plurality of first and second pixels PX1 and PX2.

The light L1 and L2 passing through the third photoelectric conversion part PD3 may be incident onto the first and second color filters CF1 and CF2. The first pixels PX1 may include the first color filter CF1 and the first photoelectric conversion part PD1. The second pixels PX2 may include the second color filter CF2 and the second photoelectric conversion part PD2. The first photoelectric conversion part PD1 may be provided below the first color filter CF1, and the second photoelectric conversion part PD2 may be provided below the second color filter CF2.

The light L1 of the first wavelength may pass through the first color filter CF1 but may not pass through the second color filter CF2. The light L2 of the second wavelength may pass through the second color filter CF2 but may not pass through the first color filter CF1. The light L1 of the first wavelength passing through the first color filter CF1 may be incident onto the first photoelectric conversion part PD1. The first photoelectric conversion part PD1 may generate a first photoelectric signal S1 from the light L1 of the first wavelength. The light L2 of the second wavelength passing through the second color filter CF2 may be incident onto the second photoelectric conversion part PD2. The second photoelectric conversion part PD2 may generate a second photoelectric signal S2 from the light L2 of the second wavelength.

Figure 2:
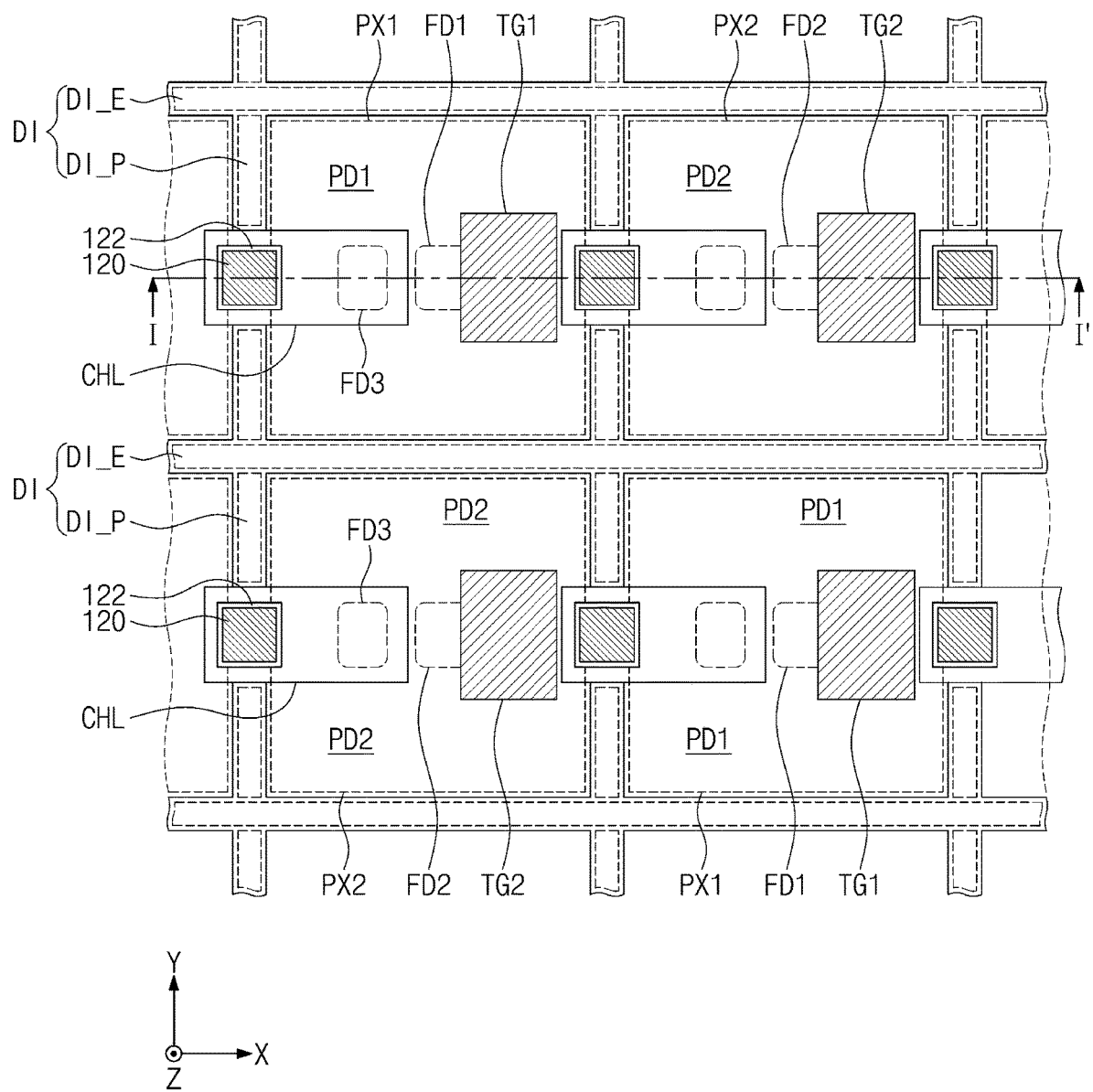
FIG. 2 illustrates a plan view of an image sensor according to embodiments of the inventive concepts.
Figure 3:
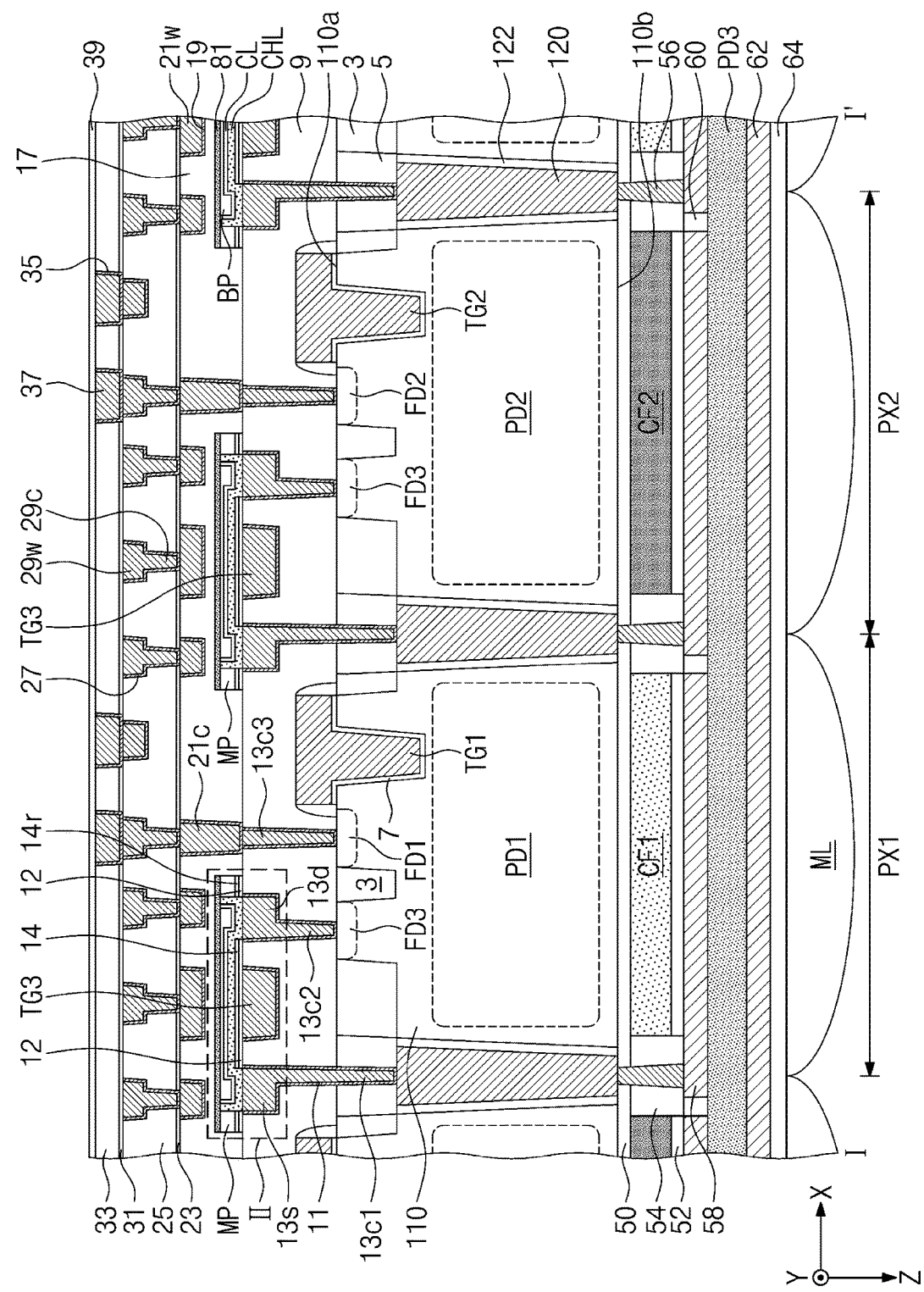
FIG. 3 illustrates a sectional view taken along a line I-I' of FIG. 2 showing an image sensor according to embodiments of the inventive concepts.
Figure 4A:
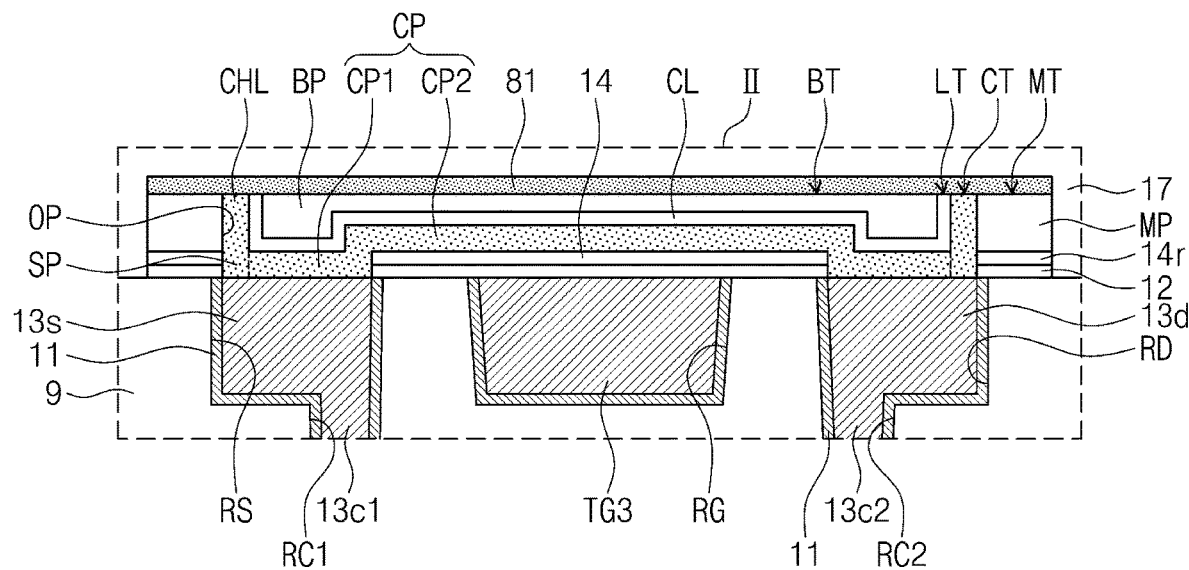
FIG. 4A illustrates an enlarged sectional view of a portion 'II' of FIG. 3.
Figure 4B:
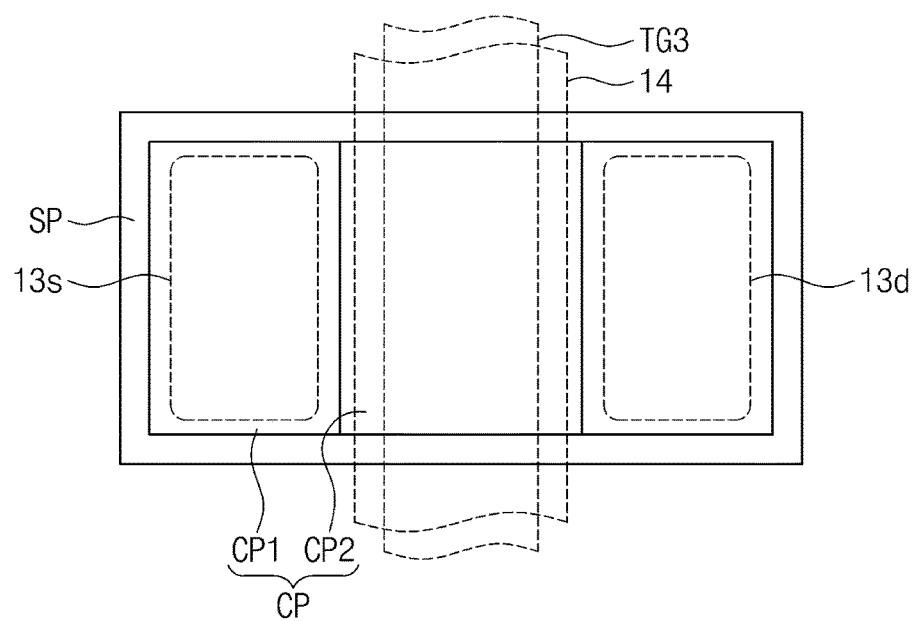
FIG. 4B illustrates a plan view of a channel pattern.

FIG. 2 illustrates a plan view of an image sensor according to embodiments of the inventive concepts. FIG. 3 illustrates a sectional view taken along a line I-I' of FIG. 2 showing an image sensor according to embodiments of the inventive concepts. FIG. 4A illustrates an enlarged sectional view of portion 'II' of FIG. 3. FIG. 4B illustrates a plan view of a channel pattern.

Referring to FIGS. 2, 3, 4A, and 4B, the semiconductor substrate 110 may include a first pixel PX1 and a second pixel PX2. The semiconductor substrate 110 may be a single crystalline silicon wafer or an epitaxial silicon layer. The semiconductor substrate 110 may be doped with impurities of a first conductivity type. For example, the first conductivity type may be a p type. The impurities of the first conductivity type may be, for example, boron. The semiconductor substrate 110 may include a first surface 110a and a second surface 110b facing each other. The first surface 110a may be a front surface, on which transistors are disposed. The second surface 110b may be a rear surface, to which light is incident thereon. In an embodiment, the image sensor may be an image sensor receiving incident light through its rear surface.

A deep device isolation part DI may be disposed in the semiconductor substrate 110 to separate the first pixel PX1 and the second pixel PX2 from each other. The deep device isolation part DI may include an extended portion DI_E which extends in a first direction X, and protruding portions DI_P which protrude from the extended portion DI_E in a second direction Y crossing the first direction X or in a direction opposite to the second direction Y. The deep device isolation part DI may be formed of or include at least one of, for example, silicon oxide, metal oxides (e.g., hafnium oxide and aluminum oxide), or poly silicon.

When viewed in a plan view, a through electrode 120 may be disposed between the protruding portions DI_P, which are adjacent to each other in the second direction Y, of the deep device isolation part DI. The through electrode 120 may extend in a third direction Z crossing the first and second directions X and Y. The through electrode 120 may include doped polysilicon or conductive materials (e.g., tungsten). A via insulating layer 122 may be interposed between the through electrode 120 and the semiconductor substrate 110. The via insulating layer 122 may be formed of or include at least one of, for example, silicon oxide, silicon nitride, or silicon oxynitride and may have a single- or multi-layered structure.

A shallow device isolation part 3 may be disposed in the first surface 110a of the semiconductor substrate 110 to define active regions of the first and second pixels PX1 and PX2. The shallow device isolation part 3 may be formed of or include at least one of, for example, silicon oxide, silicon nitride, or silicon oxynitride.

Top surfaces of the through electrode 120 and the via insulating layer 122 may be located at a level equal to or lower than a bottom surface of the shallow device isolation part 3. An insulating gapfill layer 5 may be disposed on the through electrode 120 and the via insulating layer 122. The insulating gapfill layer 5 may be formed of or include at least one of, for example, silicon oxide, silicon nitride, or silicon oxynitride. Bottom surfaces of the through electrode 120 and the via insulating layer 122 may be substantially coplanar with the second surface 110b of the semiconductor substrate 110.

In the first pixel PX1, the first photoelectric conversion part PD1 may be disposed in the semiconductor substrate 110. In the second pixel PX2, the second photoelectric conversion part PD2 may be disposed in the semiconductor substrate 110. The first and second photoelectric conversion parts PD1 and PD2 may be impurity regions doped to have a second conductivity type different from the first conductivity type. For example, the second conductivity type may be an n type, and the impurity of the second conductivity type may be phosphorus or arsenic. The first and second photoelectric conversion parts PD1 and PD2 and the semiconductor substrate 110 adjacent thereto may constitute pn junctions, serving as photodiodes.

In the first pixel PX1, a first transfer gate electrode TG1 may be disposed on the first surface 110a of the semiconductor substrate 110. In the second pixel PX2, a second transfer gate electrode TG2 may be disposed on the first surface 110a of the semiconductor substrate 110. A first gate insulating layer 7 may be interposed between the first transfer gate electrode TG1 and the semiconductor substrate 110, and between the second transfer gate electrode TG2 and the semiconductor substrate 110. The gate insulating layer 7 may include, for example, a silicon oxide layer.

In the first pixel PX1, a first floating diffusion region FD1 may be disposed in the semiconductor substrate 110 adjacent to the first transfer gate electrode TG1. A third floating diffusion region FD3 may be disposed in a region of the semiconductor substrate 110 adjacent to the first surface 110a. The third floating diffusion region FD3 may be spaced apart from the first floating diffusion region FD1 by the shallow device isolation part 3. In the second pixel PX2, a second floating diffusion region FD2 may be disposed in the semiconductor substrate 110 adjacent to the second transfer gate electrode TG2. The third floating diffusion region FD3 may be disposed in a region of the semiconductor substrate 110 adjacent to the first surface 110a. The third floating diffusion region FD3 may be spaced apart from the second floating diffusion region FD2 by the shallow device isolation part 3. The first to third floating diffusion regions FD1, FD2, and FD3 may be impurity regions, which are doped with the impurity of the second conductivity type.

The first surface 110a of the semiconductor substrate 110 may be covered with a first interlayered insulating layer 9. The first interlayered insulating layer 9 may be formed of or include at least one of, for example, silicon oxide, silicon nitride, silicon oxynitride, or porous oxide materials. First to third recess regions RS, RG, and RD, which are spaced apart from each other, may be formed in an upper portion of the first interlayered insulating layer 9. A first contact hole RC1 may be formed below the first recess region RS, and a second contact hole RC2 may be formed below the third recess region RD. A source electrode 13s may be disposed in the first recess region RS. A third transfer gate electrode TG3 may be disposed in the second recess region RG. A drain electrode 13d may be disposed in the third recess region RD. A first-level first contact plug 13c1 may be disposed in the first contact hole RC1 to electrically connect the source electrode 13s to the through electrode 120. The first-level first contact plug 13c1 may be extended into the insulating gapfill layer 5 and may be connected to the through electrode 120. A first-level second contact plug 13c2 may be disposed in the second contact hole RC2 to electrically connect the drain electrode 13d to the third floating diffusion region FD3. A first-level third contact plug 13c3, which is spaced apart from the first-level second contact plug 13c2 and is electrically connected to the first or second floating diffusion region FD1 or FD2, may be disposed in the first interlayered insulating layer 9. The first-level contact plugs 13c1, 13c2, and 13c3, the source electrode 13s, the drain electrode 13d, and the third transfer gate electrode TG3 may be formed of or include the same conductive material (e.g., tungsten). A first diffusion barrier layer 11 may be provided to cover side and bottom surfaces of the first-level contact plugs 13c1, 13c2, and 13c3, the source electrode 13s, the drain electrode 13d, and the third transfer gate electrode TG3. The first diffusion barrier layer 11 may include, for example, a titanium nitride layer. Top surfaces of the third contact plug 13c3, the source electrode 13s, the drain electrode 13d, and the third transfer gate electrode TG3 may be substantially coplanar with a top surface of the first interlayered insulating layer 9.

A first etch stop layer 12 may be disposed on the third transfer gate electrode TG3. The first etch stop layer 12 may be formed of an insulating layer having an etch selectivity with respect to the first interlayered insulating layer 9. For example, the first etch stop layer 12 may be formed of a silicon nitride layer.

A second gate insulating layer 14 may be disposed on the third transfer gate electrode TG3. The second gate insulating layer 14 may be formed of or include at least one of, for example, silicon oxide or metal oxide materials (e.g., aluminum oxide) having a dielectric constant higher than silicon oxide. A portion of the first etch stop layer 12 may be interposed between the second gate insulating layer 14 and the third transfer gate electrode TG3 and may be used as an additional gate insulating layer.

A molding pattern MP may be provided on the second gate insulating layer 14. The molding pattern MP may be provided on the third transfer gate electrode TG3. In more detail, the molding pattern MP may be extended from a region on the third transfer gate electrode TG3 to regions on the source and drain electrodes 13s and 13d. In an embodiment, the molding pattern MP may be formed of or include at least one of silicon nitride or silicon oxynitride. A side surface of the second gate insulating layer 14 may be aligned to a side surface of the molding pattern MP. A side surface of the first etch stop layer 12 may be aligned to the side surface of the molding pattern MP. The molding pattern MP may include an opening OP. The opening OP may be formed to expose the source and drain electrodes 13s and 13d.

A channel pattern CHL may be placed in the opening OP. The channel pattern CHL may be locally confined in the opening OP. The channel pattern CHL may cover the source electrode 13s, the drain electrode 13d, and the second gate insulating layer 14. The channel pattern CHL may be formed of or include an oxide semiconductor material. For example, the oxide semiconductor material may include at least one of indium (In), gallium (Ga), zinc (Zn), or tin (Sn). In an embodiment, the oxide semiconductor material may be indium-gallium-zinc oxide (IGZO) containing indium (In), gallium (Ga), and zinc (Zn). In an embodiment, the oxide semiconductor material may be an amorphous IGZO. The third transfer gate electrode TG3, the source electrode 13s, the drain electrode 13d, the second gate insulating layer 14, and the channel pattern CHL may constitute a third transfer transistor Tx3 of FIG. 5C. The channel pattern CHL may penetrate the second gate insulating layer 14 and the first etch stop layer 12. A remaining gate insulating layer 14r may be laterally extended from a side surface of the channel pattern CHL.

The channel pattern CHL may include a sidewall portion SP which covers the side surface of the opening OP, and a center portion CP which is extended from the sidewall portion to a region on the first interlayered insulating layer 9 defining the bottom surface of the opening OP. The sidewall portion SP may be in contact with the molding pattern MP. As an example, the channel pattern CHL may be a structure, which is conformally extended along the side and bottom surfaces of the opening OP. When viewed in a plan view, the sidewall portion SP may be a ring shape, which is extended along an edge of the center portion CP. In FIG. 4B, the sidewall portion SP is illustrated as having a rectangular ring shape, but the inventive concepts are not limited to this example. For example, the sidewall portion SP may be provided as having a circular ring shape, when viewed in a plan view.

The center portion CP may include a first center portion CP1 which is connected to the sidewall portion SP, and a second center portion CP2 which protrudes from the first center portion CP1 in a direction (i.e., third direction Z) away from the semiconductor substrate 110. The first center portion CP1 may be in contact with a top surface of the source electrode 13s and a top surface of the drain electrode 13d. The second center portion CP2 may cover the second gate insulating layer 14.

A planarization pattern BP may be provided on the channel pattern CHL to fill the opening OP. The planarization pattern BP may be formed of or include at least one of silicon oxide or oxynitride. As a result of a planarization process to be described below, a top surface BT of the planarization pattern BP may be flat. The top surface BT of the planarization pattern BP may be coplanar with a top surface CT of the channel pattern CHL. As an example, the top surface BT of the planarization pattern BP and the top surface CT of the channel pattern CHL may be located at substantially the same height. The top surface BT of the planarization pattern BP may be coplanar with a top surface MT of the molding pattern MP. In the present specification, the term "coplanar" will be used to represent that, as a result of the planarization process, elements have substantially the same height, within a small difference given by a process margin.

An intervening layer CL may be provided between the channel pattern CHL and the planarization pattern BP. As an example, the intervening layer CL may include a metal nitride layer (e.g., TiN) or a silicon nitride layer. A top surface LT of the intervening layer CL may be coplanar with the top surface BT of the planarization pattern BP and the top surface CT of the channel pattern CHL. In certain embodiments, the intervening layer CL may be omitted, and the channel pattern CHL and the planarization pattern BP may be in contact with each other.

An upper insulating pattern 81 may be provided to cover the molding pattern MP, the channel pattern CHL, and the planarization pattern BP. As an example, the upper insulating pattern 81 may be provided to cover the top surface MT of the molding pattern MP, the top surface CT of the channel pattern CHL, and the top surface BT of the planarization pattern BP, which are coplanar with each other, conformally (i.e., with substantially the same thickness). A side surface of the upper insulating pattern 81 may be aligned to the side surface of the molding pattern MP. The upper insulating pattern 81 may be formed of or include at least one of silicon nitride or silicon oxynitride.

A second interlayered insulating layer 17 may be disposed on the upper insulating pattern 81. Second-level lines 21w and second-level contact plugs 21c may be disposed in the second interlayered insulating layer 17. Side and bottom surfaces of the second-level lines 21w and the second-level contact plugs 21c may be covered with a second diffusion barrier layer 19. The second-level lines 21w and the second-level contact plugs 21c may contain a metallic material that is different from that of the source electrode 13s, the third transfer gate electrode TG3, and the drain electrode 13d. As an example, the second-level lines 21w and the second-level contact plugs 21c may contain copper.

A third etch stop layer 23 and a third interlayered insulating layer 25 may be sequentially formed on the second interlayered insulating layer 17. Third-level lines 29w and third-level contact plugs 29c may be disposed in the third interlayered insulating layer 25. Side and bottom surfaces of the third-level lines 29w and the third-level contact plugs 29c may be covered with a third diffusion barrier layer 27. A fourth etch stop layer 31 and a fourth interlayered insulating layer 33 may be sequentially stacked on the third interlayered insulating layer 25. Fourth-level lines 37 and a fourth diffusion barrier layer 35 may be disposed in the fourth interlayered insulating layer 33, and here, the fourth diffusion barrier layer 35 may be provided to cover side and bottom surfaces of the fourth-level lines 37. The fourth interlayered insulating layer 33 may be covered with a first passivation layer 39. The third and fourth etch stop layers 23 and 31 may include, for example, a silicon nitride layer. The third and fourth interlayered insulating layers 25 and 33 may include, for example, a silicon oxide layer or a porous insulating layer. The third-level lines 29w, the third-level contact plugs 29c, and the fourth-level lines 37 may include, for example, copper. The third and fourth diffusion barrier layers 27 and 35 may include, for example, a metal nitride layer (e.g., a titanium nitride layer). The passivation layer 39 may include, for example, a silicon nitride layer or a polyimide layer.

A protection layer 50 may be disposed on the second surface 110b of the semiconductor substrate 110. The protection layer 50 may include an insulating layer (e.g., a silicon oxide layer). In an embodiment, the protection layer 50 may be in contact with the second surface 110b and may have negative fixed charges. Here, the protection layer 50 may be formed of metal oxide or metal fluoride containing at least one metallic element selected from the group consisting of hafnium (Hf), zirconium (Zr), aluminum (Al), tantalum (Ta), titanium (Ti), yttrium (Y), and lanthanide. For example, the protection layer 50 may be formed of or include hafnium oxide or aluminum oxide.

In the first pixel PX1, the first color filter CF1 may be disposed on the protection layer 50. In the second pixel PX2, the second color filter CF2 may be disposed on the protection layer 50. The first color filter CF1 and the second color filter CF2 may include pigments or dyes of different colors. A first insulating pattern 54 may be interposed between the first and second color filters CF1 and CF2. In an embodiment, the first insulating pattern 54 may be formed of or include a material, whose refractive index is lower than those of the first and second color filters CF1 and CF2. In this case, it may be possible to increase an amount of light to be incident into the pixels PX1 and PX2 and to improve a light sensing property of the pixels PX1 and PX2.

Pixel electrodes 58 may be disposed on the first and second color filters CF1 and CF2, respectively. A second insulating pattern 52 may be interposed between the pixel electrode 58 and each of the first and second color filters CF1 and CF2. The second insulating pattern 52 may be formed of or include at least one of insulating materials (e.g., silicon oxide or silicon nitride). The pixel electrode 58 may include indium-tin oxide (ITO), indium-zinc oxide (IZO), zinc oxide (ZnO), and/or organic transparent conductive materials. The pixel electrode 58 may be electrically connected to the through electrode 120 through a first via plug 56 penetrating the first insulating pattern 54. A third insulating pattern 60 may be interposed between the pixel electrodes 58.

The third photoelectric conversion part PD3 may be disposed on the pixel electrodes 58. The third photoelectric conversion part PD3 may be, for example, an organic photoelectric conversion layer. The third photoelectric conversion part PD3 may include a p-type organic semiconductor material and an n-type organic semiconductor material, and the p-type organic semiconductor material and the n-type organic semiconductor material may constitute a pn junction. In an embodiment, the third photoelectric conversion part PD3 may be formed of or include at least one of quantum dots or chalcogenide materials.

A common electrode 62 may be disposed on the third photoelectric conversion part PD3. The common electrode 62 may include indium-tin oxide (ITO), indium-zinc oxide (IZO), zinc oxide (ZnO), and/or organic transparent conductive materials. The pixel electrodes 58 may be respectively provided in every pixel, whereas the third photoelectric conversion part PD3 and the common electrode 62 may not be separated and may be provided throughout the second surface 110b of the semiconductor substrate 110. A second passivation layer 64 may be disposed on the common electrode 62. A micro lens ML may be disposed on the second passivation layer 64.

Figure 5A:
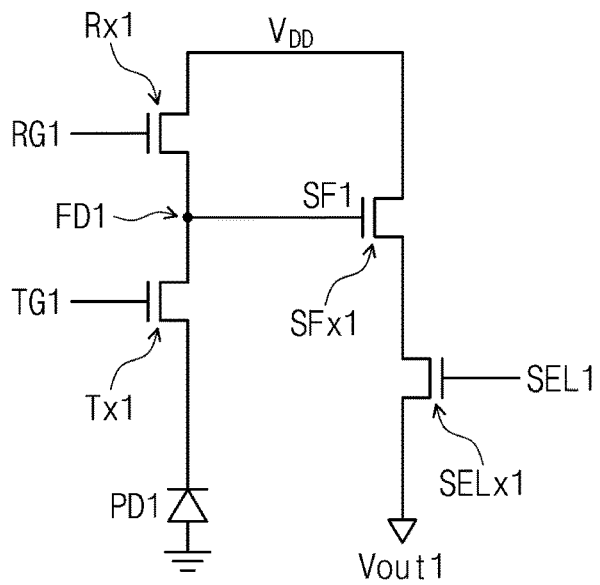
FIG. 5A illustrates a circuit diagram of an image sensor according to embodiments of the inventive concepts.
Figure 5B:
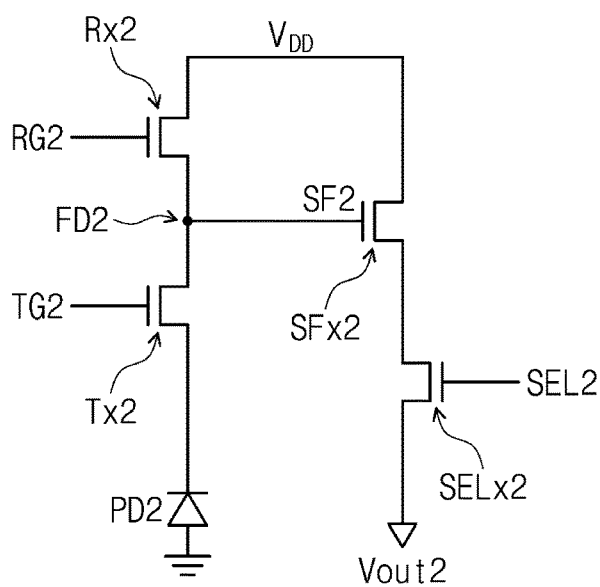
FIG. 5B illustrates a circuit diagram of another image sensor according to embodiments of the inventive concepts.
Figure 5C:
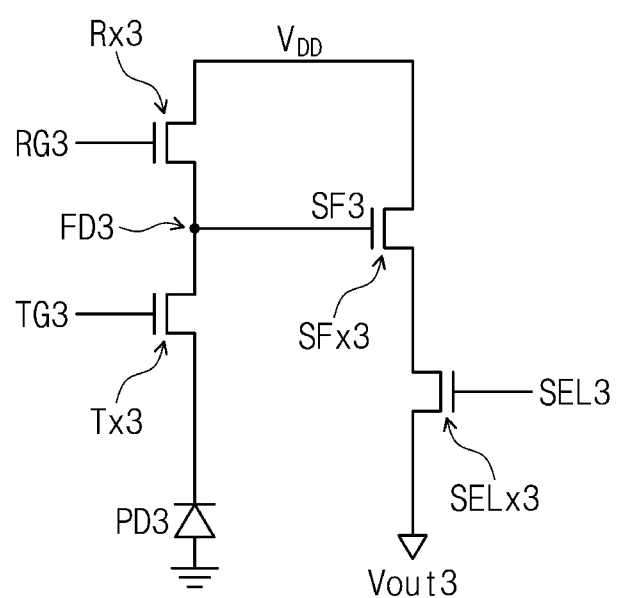
FIG. 5C illustrates a circuit diagram of still another image sensor according to embodiments of the inventive concepts.

FIGS. 5A, 5B and 5C illustrate respective circuit diagrams of image sensors according to embodiments of the inventive concepts.

Referring to FIGS. 1 to 3, 4A, 4B, and 5A to 5C, a first transfer transistor Tx1 including the first transfer gate electrode TG1 and the first floating diffusion region FD1 may be disposed in the first pixel PX1. A first reset transistor Rx1 including a first reset gate electrode RG1, a first source follower transistor SFx1 including a first source follower gate electrode SF1, and a first selection transistor SELx1 including a first selection gate electrode SEL1 may be disposed in the first pixel PX1. A second transfer transistor Tx2 including the second transfer gate electrode TG2 and the second floating diffusion region FD2 may be disposed in the second pixel PX2. A second reset transistor Rx2 including a second reset gate electrode RG2, a second source follower transistor SFx2 including a second source follower gate electrode SF2, and a second selection transistor SELx2 including a second selection gate electrode SEL2 may be disposed in the second pixel PX2. Each of the first pixel PX1 and the second pixel PX2 may include the third transfer transistor Tx3 including the third transfer gate electrode TG3 and the third floating diffusion region FD3.

A third reset transistor Rx3 including a third reset gate electrode RG3, a third source follower transistor SFx3 including a third source follower gate electrode SF3, and a third selection transistor SELx3 including a third selection gate electrode SEL3 may be disposed in the first pixel PX1 or the second pixel PX2. The first to third reset transistors Rx1, Rx2, and Rx3 and the first to third source follower transistors SFx1, SFx2, and SFx3 may be connected to voltage $V_{DD}$. The first pixel PX1 and the second pixel PX2 may share the first to third reset transistors Rx1, Rx2, and Rx3. For example, one reset transistor may be electrically connected to the first to third transfer transistors Tx1, Tx2, and Tx3 and may serve as the first to third reset transistors Rx1, Rx2, and Rx3. Similarly, the first pixel PX1 and the second pixel PX2 may share the first to third source follower transistors SFx1, SFx2, and SFx3 and the first to third selection transistors SELx1, SELx2, and SELx3.

Color information obtained by the first photoelectric conversion part PD1 may be output as a first signal Vout1 through the first transfer transistor Tx1, the first reset transistor Rx1, the first source follower transistor SFx1, and the first selection transistor SELx1. Color information obtained by the second photoelectric conversion part PD2 may be output as a second signal Vout2 through the second transfer transistor Tx2, the second reset transistor Rx2, the second source follower transistor SFx2, and the second selection transistor SELx2. Color information obtained by the third photoelectric conversion part PD3 may be output as a third signal Vout3 through the third transfer transistor Tx3, the third reset transistor Rx3, the third source follower transistor SFx3, and the third selection transistor SELx3.

According to the afore-described embodiments of the inventive concepts, the image sensor may include the third transfer transistor Tx3, which is used to transfer charges generated in the third photoelectric conversion part PD3. That is, the image sensor may include a 4-transistor CDS (Correlated Double sampling) circuit including four transistors, which are used to transfer each color information. This may make it possible to reduce reset noise. In addition, the third transfer transistor Tx3 makes it possible to more quickly transfer charges which are generated in the third photoelectric conversion part PD3 to the third floating diffusion region FD3. Thus, it may be possible to provide a highly integrated image sensor capable of realizing an improved image quality.

FIGS. 6A, 6B, 6C, 6D, 6E, 6F, 6G and 6H illustrate sectional views sequentially showing a process of fabricating an image sensor having a vertical section taken along a line I-I' of FIG. 2.

Figure 6A:
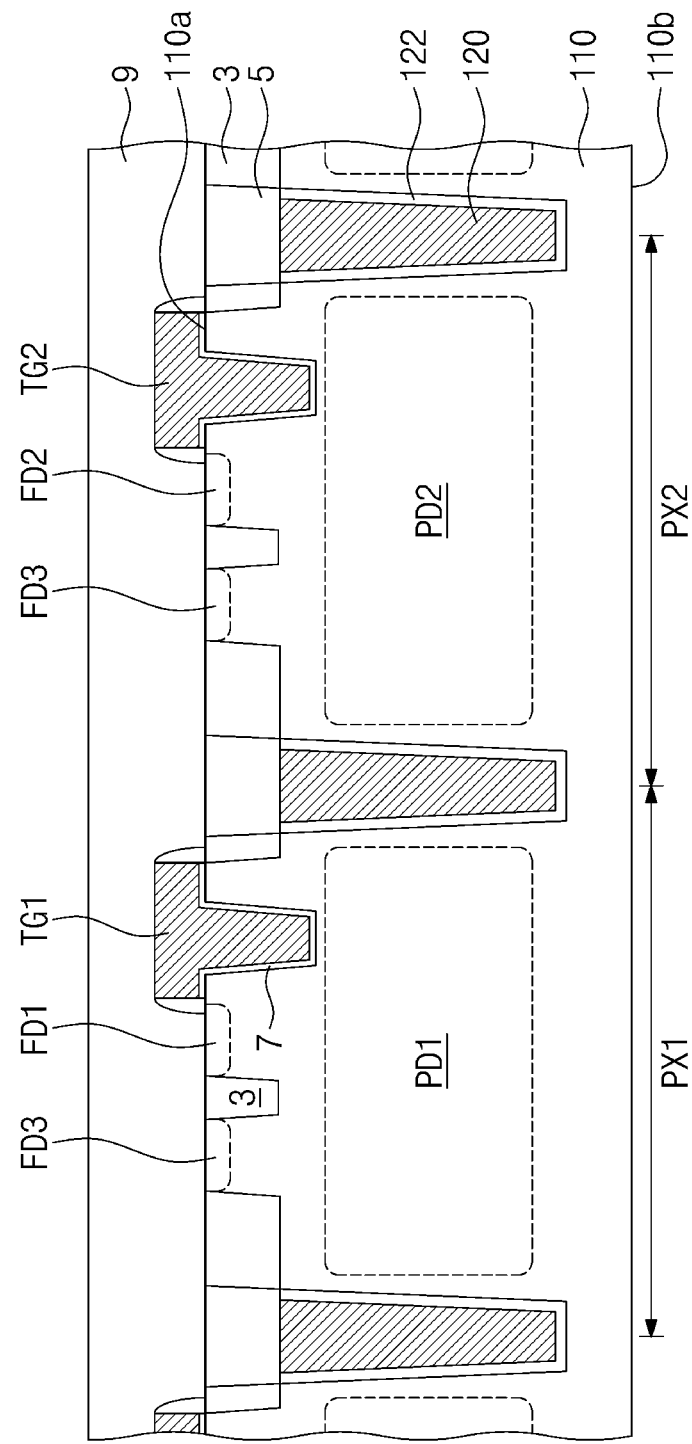
FIGS. 6A, 6B, 6C, 6D, 6E, 6F, 6G and 6H illustrate sectional views sequentially showing a process of fabricating an image sensor taken along a line I-I' of FIG. 2.

Referring to FIGS. 2 and 6A, the semiconductor substrate 110 including the first pixel PX1 and the second pixel PX2 may be prepared. The semiconductor substrate 110 may be doped with impurities of a first conductivity type (e.g., p type conductivity). The first photoelectric conversion part PD1 and the second photoelectric conversion part PD2 may be formed in the semiconductor substrate 110 by performing an ion implantation process several times and performing a thermal treatment process. The first and second photoelectric conversion parts PD1 and PD2 may be doped to have a second conductivity type (e.g., n type conductivity) different from the first conductivity type. A shallow trench isolation (STI) process may be performed to form the shallow device isolation part 3 in the semiconductor substrate 110 and near the first surface 110a. The deep device isolation part DI of FIG. 2 may be formed between the pixels PX1 and PX2 by patterning the shallow device isolation part 3 and the semiconductor substrate 110 thereunder to form a deep trench, sequentially forming an insulating layer and a poly-silicon layer to fill the deep trench, and then, performing a polishing or etch-back process on the insulating layer and the poly-silicon layer.

The protruding portion DI_P of the deep device isolation part DI may be partially removed to form a penetration via hole, then the via insulating layer 122 and a conductive layer may be formed to fill the penetration via hole, and then a polishing or etch-back process may be performed to form the through electrode 120 in the penetration via hole. An upper portion of the through electrode 120 may be recessed, and the insulating gapfill layer 5 may be formed to fill the recessed portion. In the first and second pixels PX1 and PX2, the first gate insulating layer 7 and the first and second transfer gate electrodes TG1 and TG2 may be formed on the first surface 110a of the semiconductor substrate 110. Each of the first and second transfer gate electrodes TG1 and TG2 may be formed to have a portion extended into the semiconductor substrate 110. An ion implantation process may be performed to form the first and second floating diffusion regions FD1 and FD2 in portions of the semiconductor substrate 110 around the first and second transfer gate electrodes TG1 and TG2. In an embodiment, during this step, the third floating diffusion region FD3 may be formed in a region of the semiconductor substrate 110 delimited by the shallow device isolation part 3. The first interlayered insulating layer 9 may be formed to cover the first surface 110a of the semiconductor substrate 110.

Figure 6B:
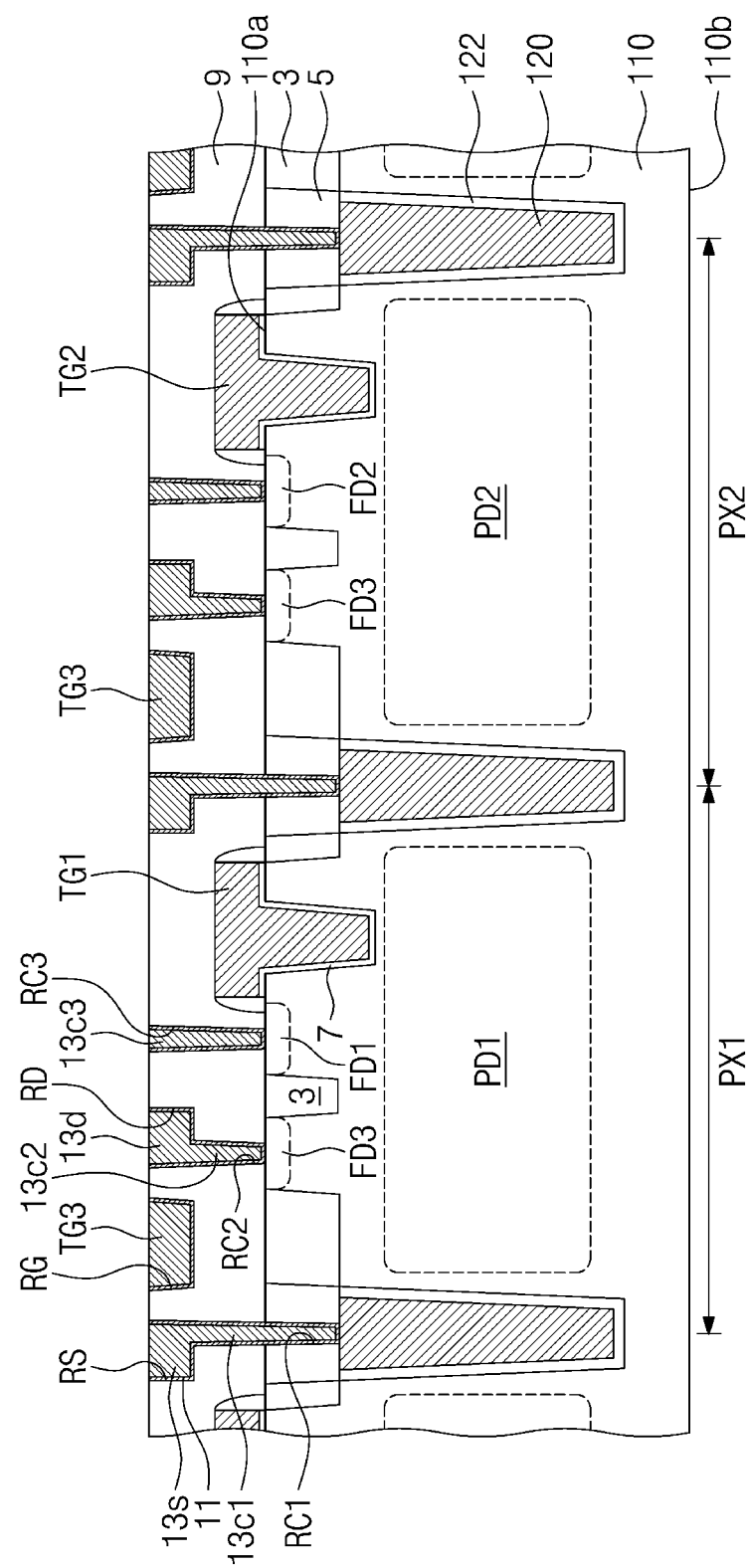

Referring to FIG. 6B, the first interlayered insulating layer 9 may be etched to form the first to third recess regions RS, RG, and RD and the first to third contact holes RC1, RC2, and RC3. The first recess region RS and the first contact hole RC1 may be formed to have a dual damascene hole structure, and the third recess region RD and the second contact hole RC2 may be formed to have a dual damascene hole structure. During the formation of the first contact hole RC1, a portion of the insulating gapfill layer 5 may be etched to expose a portion of a top surface of the through electrode 120. The second contact hole RC2 may be formed to expose the third floating diffusion region FD3. The third contact holes RC3 may be formed to respectively expose the first and second floating diffusion regions FD1 and FD2. The first diffusion barrier layer 11 and a conductive layer (e.g., tungsten) may be sequentially formed on the first interlayered insulating layer 9 and the insulating gapfill layer 5 to fill the first to third recess regions RS, RG, and RD and the first to third contact holes RC1, RC2, and RC3, and then, a polishing or etch-back process may be performed to form the source electrode 13s, the third transfer gate electrode TG3, the drain electrode 13d, and the first-level contact plugs 13c1, 13c2, and 13c3.

Figure 6C:
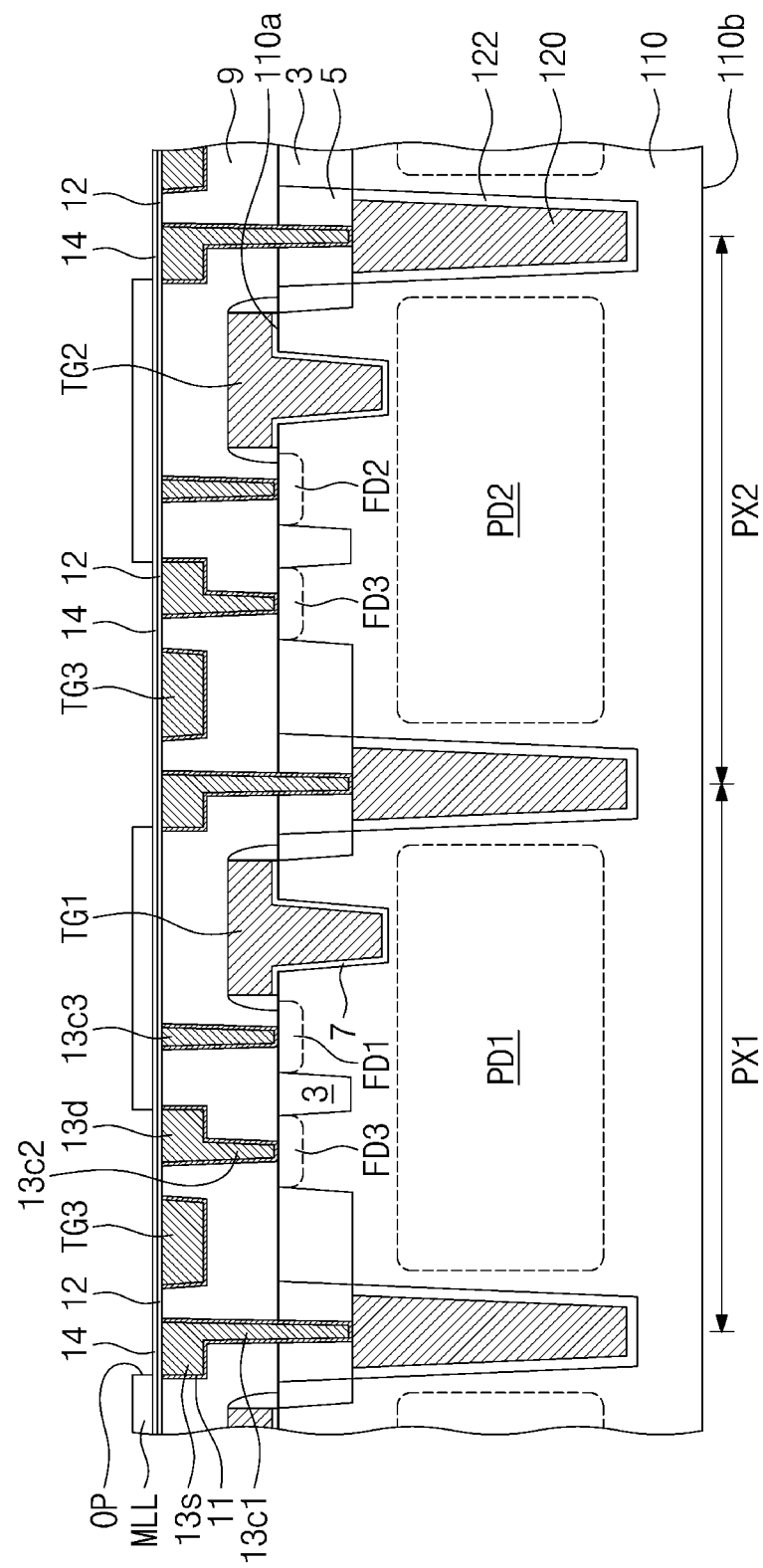

Referring to FIG. 6C, the first etch stop layer 12 and the second gate insulating layer 14 may be sequentially formed on the first interlayered insulating layer 9. The first etch stop layer 12 may be formed of or include, for example, silicon nitride. The second gate insulating layer 14 may be formed of or include, for example, aluminum oxide or silicon oxide. A molding layer MLL may be formed on the second gate insulating layer 14. The molding layer MLL may be formed of or include at least one of silicon nitride or silicon oxynitride. The molding layer MLL may be patterned to form an opening OP at a region overlapped with the source electrode 13s, the third transfer gate electrode TG3, the drain electrode 13d.

Figure 6D:
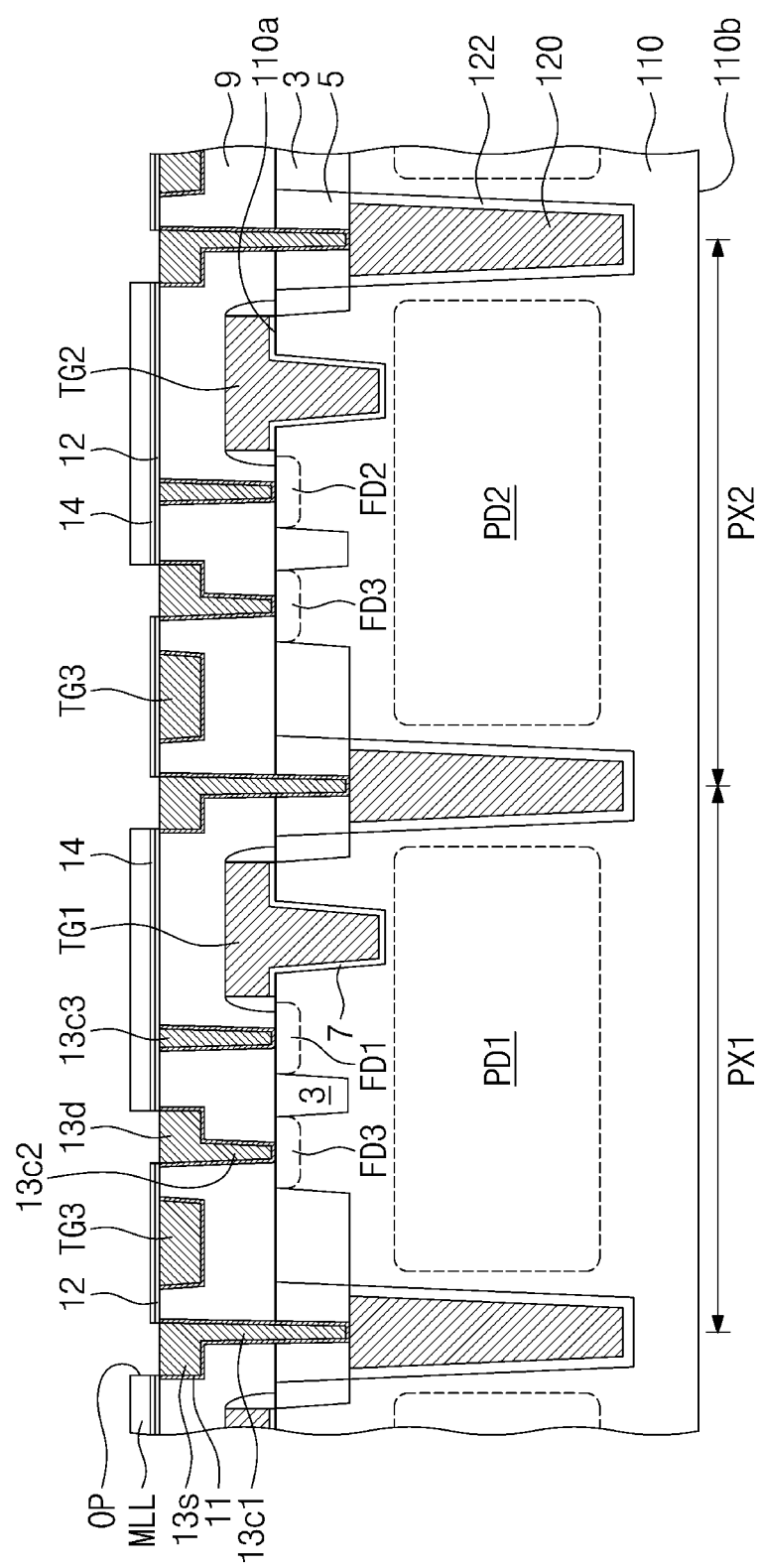

Referring to FIG. 6D, the second gate insulating layer 14 and the first etch stop layer 12 exposed by the opening OP may be etched to expose the top surfaces of the source and drain electrodes 13s and 13d. As a result, the opening OP may be expanded to expose the source and drain electrodes 13s and 13d. A portion of the second gate insulating layer 14 and a portion of the first etch stop layer 12 covering the third transfer gate electrode TG3 is not removed during this etching.

Figure 6E:
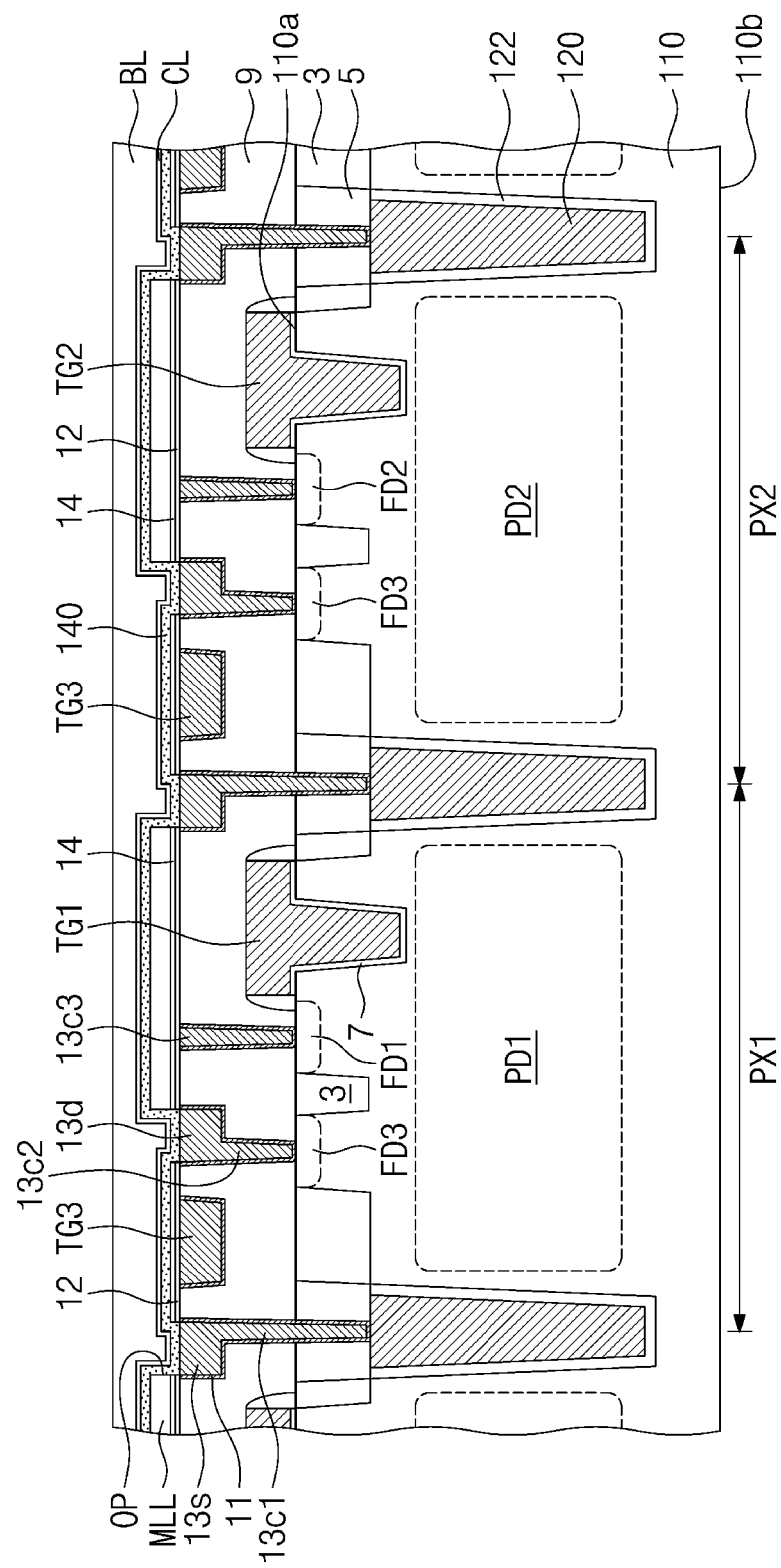

Referring to FIG. 6E, a channel layer 140, an intervening layer CL, and a planarization layer BL may be sequentially formed. As described above, the intervening layer CL may be omitted. The channel layer 140 may be conformally formed along the side and bottom surfaces of the opening OP. The channel layer 140 may be formed of or include an oxide semiconductor material (e.g., IGZO). The channel layer 140 is formed to be in contact with the source and drain electrodes 13s and 13d. The intervening layer CL may include a metal nitride layer (e.g., TiN) or a silicon nitride layer. The planarization layer BL may include at least one of a silicon oxide layer or an oxynitride layer.

Figure 6F:
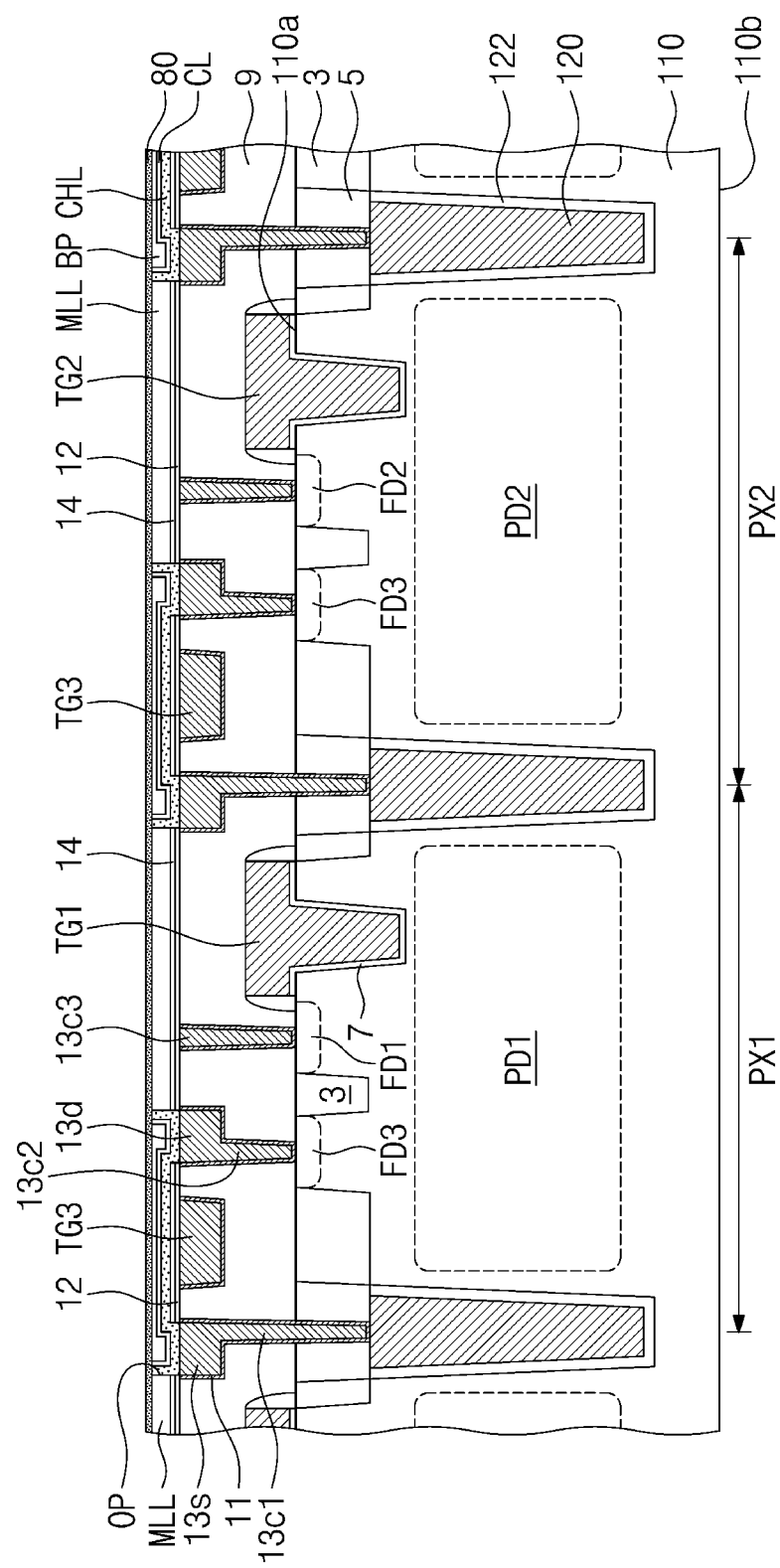

Referring to FIG. 6F, a planarization process may be performed. As an example, the planarization process may be a chemical mechanical polishing process. The planarization process may be performed to expose the top surface of the molding layer MLL. As a result of the planarization process, upper portions of the channel layer 140 on the molding layer MLL may be removed to form the channel pattern CHL in the opening OP. In other words, the channel pattern CHL may be formed by a damascene process. Similar to this, upper portions of the planarization layer BL may be removed to form the planarization pattern BP in the opening OP. After the planarization process, an upper insulating layer 80 may be formed to cover the molding layer MLL and the planarization pattern BP. The upper insulating layer 80 may be formed of or include at least one of silicon nitride or silicon oxynitride.

Figure 6G:
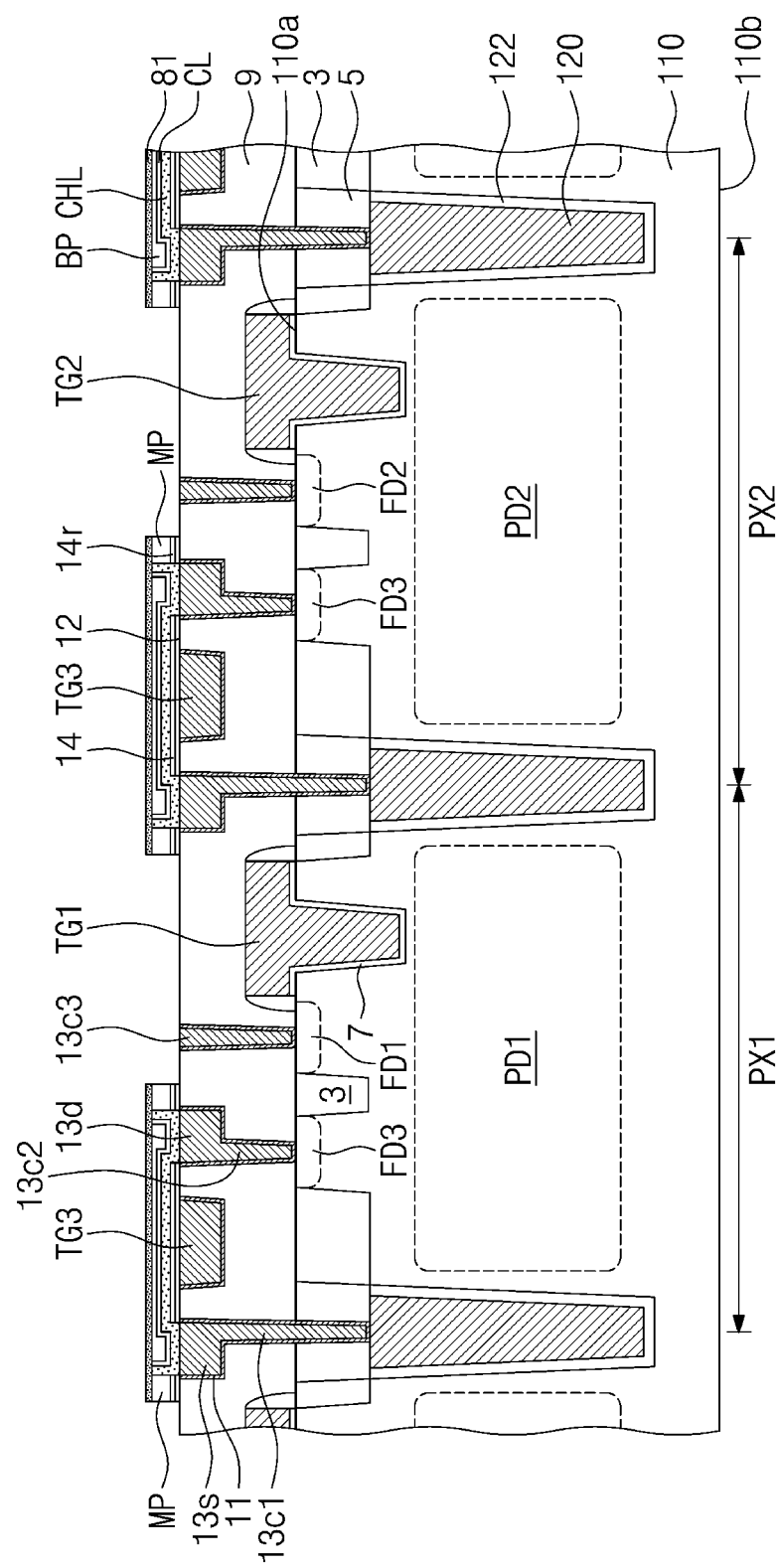

Referring to FIG. 6G, the upper insulating layer 80 and the molding layer MLL may be sequentially patterned to form the upper insulating pattern 81 and the molding pattern MP. In an embodiment, the second gate insulating layer 14 and the first etch stop layer 12 may also be patterned in this step. As a result, the remaining gate insulating layer 14r may be formed. The patterning process may be performed until the first-level third contact plug 13c3 is exposed. However, in some embodiments, a portion of the first etch stop layer 12 may remain on the first-level third contact plug 13c3. After the patterning process, an etch stop layer may be formed to cover the upper insulating pattern 81 and the exposed portions of the first interlayered insulating layer 9. However, in some embodiments, the formation of the etch stop layer that covers the upper insulating pattern 81 and the exposed portions of the first interlayered insulating layer 9 may be omitted.

Figure 6H:
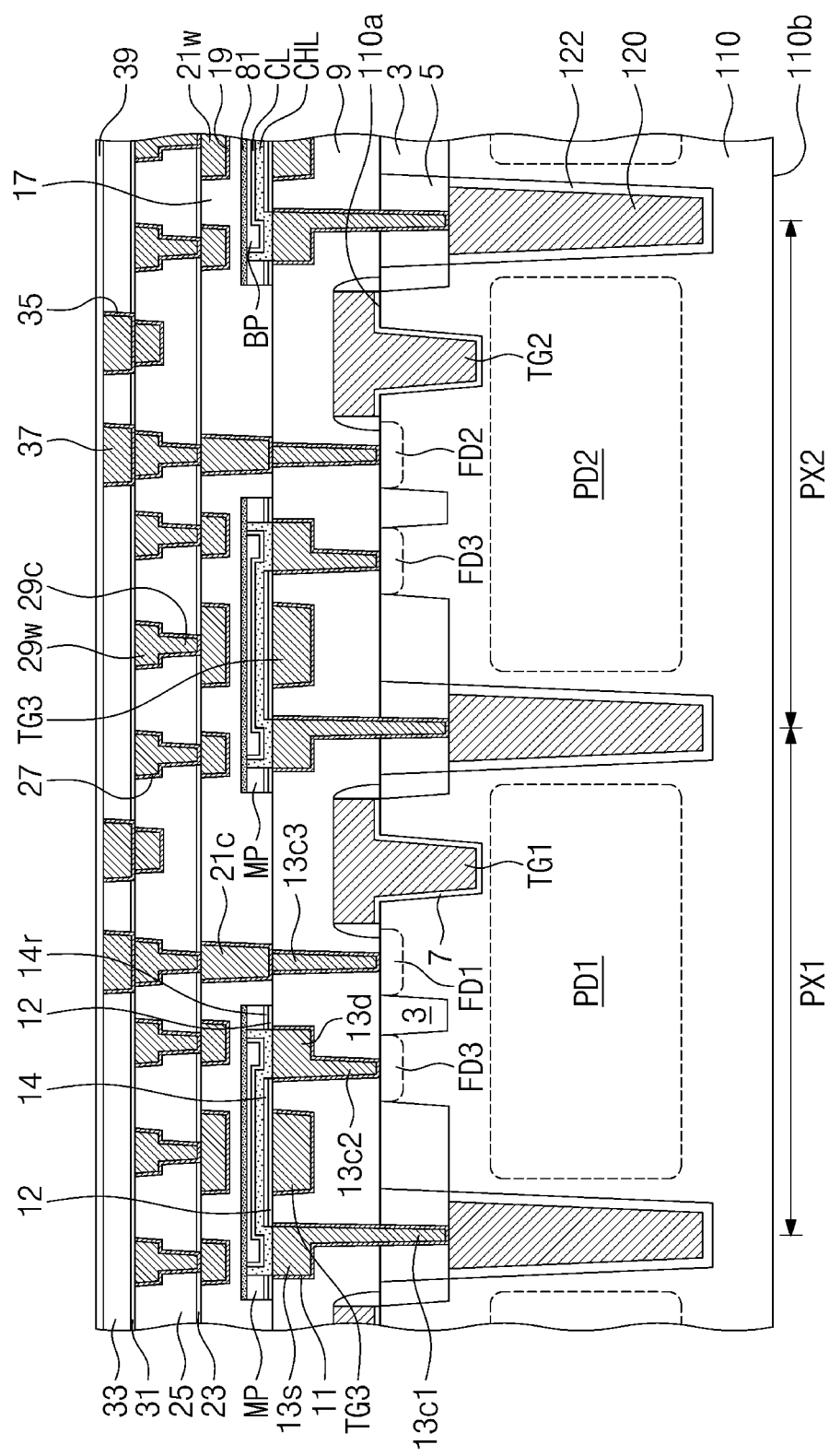

Referring to FIG. 6H, the second to fourth interlayered insulating layers 17, 25, and 33, the third and fourth etch stop layers 23 and 31, the second-level lines 21w, the second-level contact plugs 21c, the third-level lines 29w, the third-level contact plugs 29c, the fourth-level lines 37, and the first passivation layer 39 may be formed through a conventional back-end-of-line (BEOL) process.

Referring back to FIG. 3, a grinding process may be performed on the second surface 110b of the semiconductor substrate 110 to remove a portion of the semiconductor substrate 110 and to expose the through electrode 120. The protection layer 50, color filters CF1 and CF2, the first insulating pattern 54, the first via plugs 56, the pixel electrodes 58, the third insulating pattern 60, the third photoelectric conversion part PD3, the common electrode 62, the second passivation layer 64 and the micro lenses ML may be formed on the second surface 110b of the semiconductor substrate 110.

In a method of fabricating an image sensor according to embodiments of the inventive concepts, the channel pattern CHL containing an oxide semiconductor material may be formed by the damascene process. Accordingly, it may be possible to reduce a size of a transistor in the image sensor. In addition, it may be possible to prevent contamination issues, which may for example occur when etching and cleaning processes are performed on an oxide semiconductor layer. In a method of fabricating an image sensor according to embodiments of the inventive concepts, the channel pattern CHL, which is made of an oxide semiconductor material, may be formed before the BEOL process. Most interconnection lines in the BEOL process may be formed of copper, and thus, in the BEOL process, it is important to prevent an apparatus from being contaminated by copper. In the case where an oxide semiconductor material such as IGZO is used in the BEOL process, an apparatus may be contaminated by the IGZO, and in certain cases, it may be necessary to change a process sequence in the conventional BEOL process, which consequently increases complexity of the process. By contrast, in the method of fabricating an image sensor according to embodiments of the inventive concepts, since the channel pattern CHL made of an oxide semiconductor material is formed before the BEOL process, it may be possible to avoid these issues and to reduce or suppress process failure.

Figure 7:
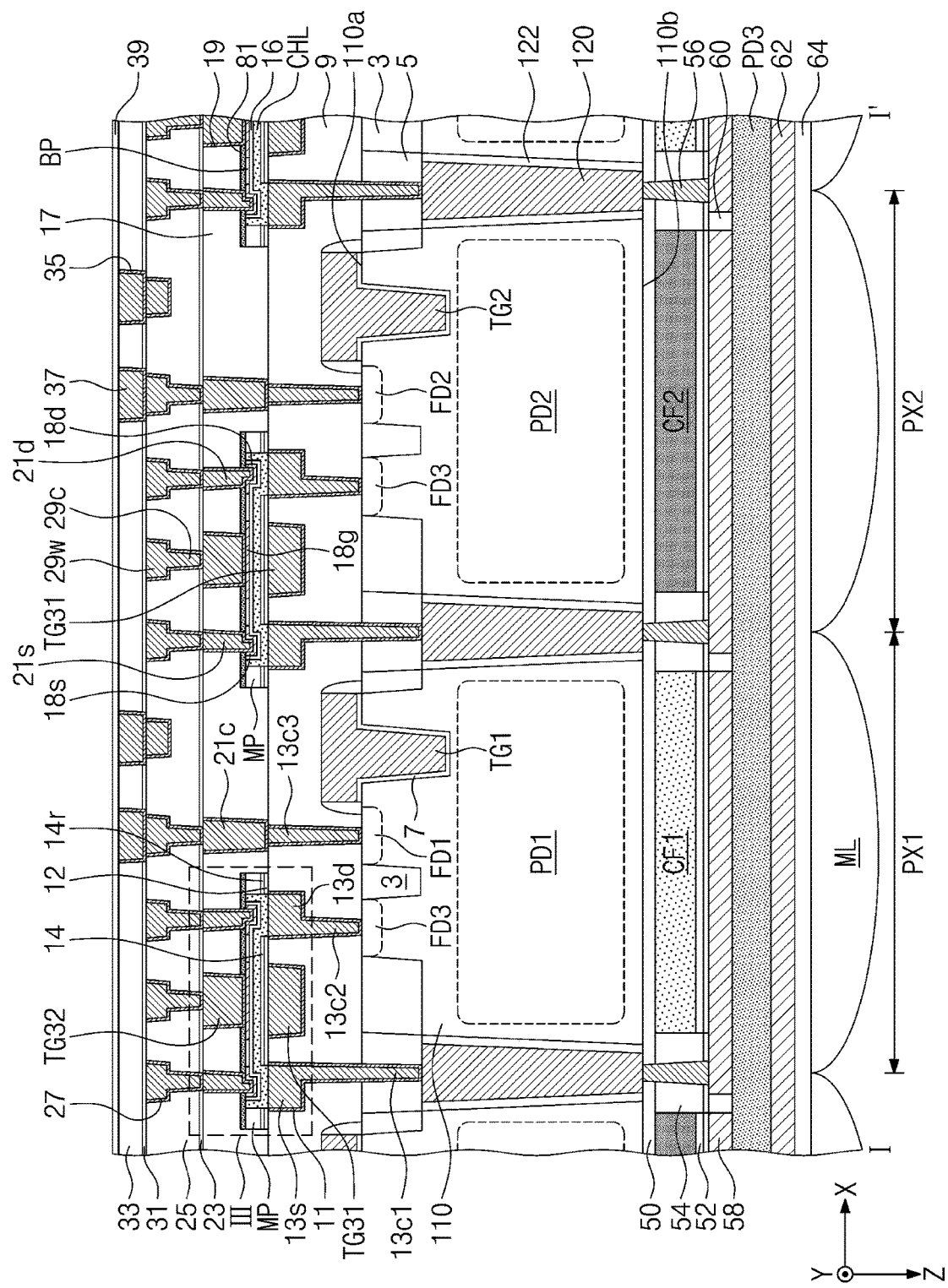
FIG. 7 illustrates a sectional view taken along a line I-I' of FIG. 2 showing an image sensor according to embodiments of the inventive concepts.
Figure 8A:
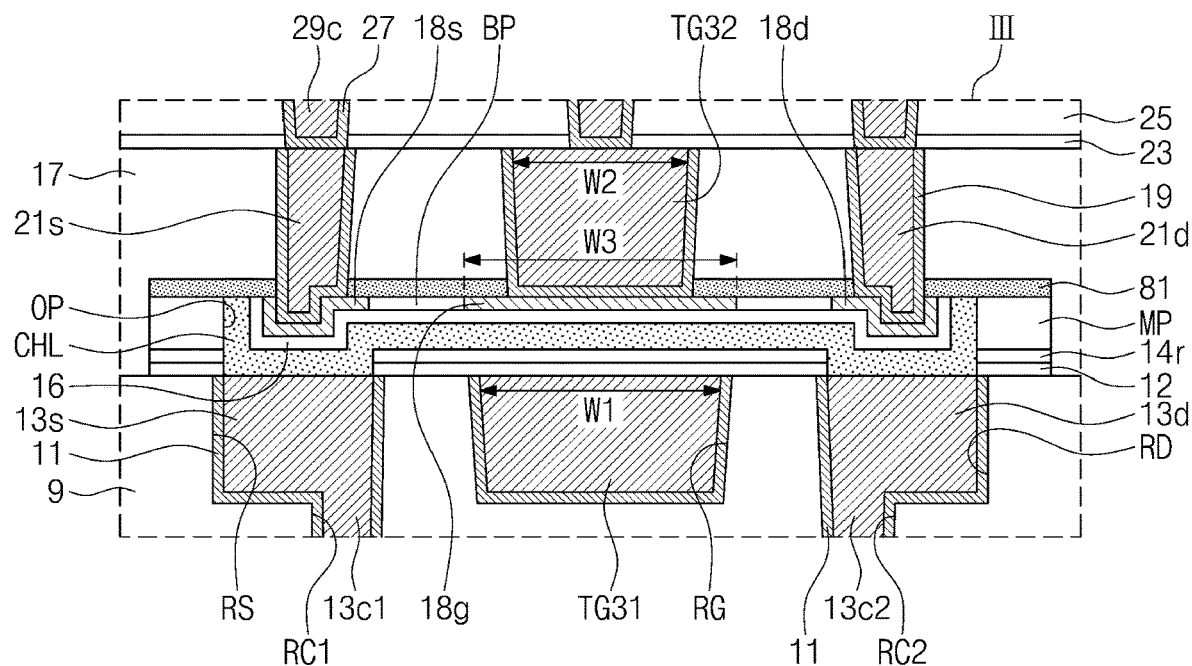
FIG. 8A illustrates an enlarged sectional view of a portion 'III' of FIG. 7.
Figure 8B:
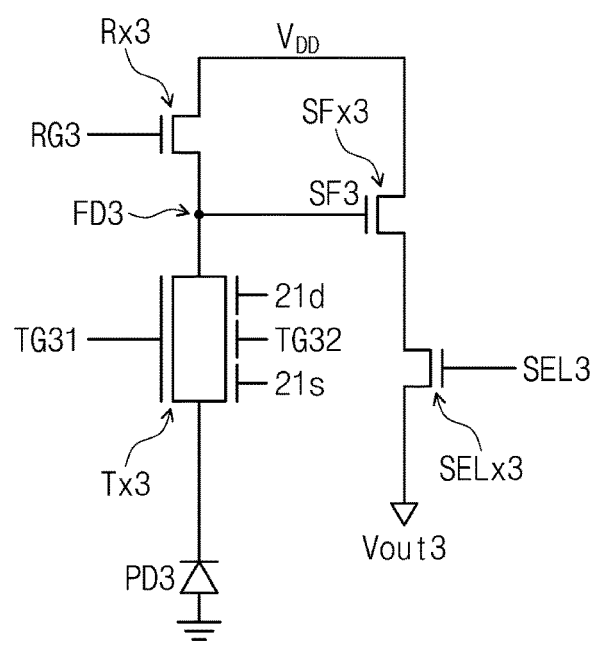
FIG. 8B illustrates a circuit diagram of an image sensor of FIG. 7.

FIG. 7 illustrates a sectional view taken along a line I-I' of FIG. 2 showing an image sensor according to embodiments of the inventive concepts. FIG. 8A illustrates an enlarged sectional view of portion 'III' of FIG. 7. FIG. 8B illustrates a circuit diagram of an image sensor of FIG. 7. For concise description, a previously described elements may be identified by the same reference numbers or characters without repeating overlapping description thereof.

Referring to FIGS. 7 and 8A, the image sensor according to the present embodiment may include a first-level source electrode 13s, a first-level third transfer gate electrode TG31, and a first-level drain electrode 13d, which are disposed in the first interlayered insulating layer 9 to be spaced apart from each other. A third gate insulating layer 16 may be disposed on the channel pattern CHL. The third gate insulating layer 16 may be an aluminum oxide layer or a silicon oxide layer. A second-level third transfer gate electrode TG32 may be disposed on (over) the third gate insulating layer 16. The second-level third transfer gate electrode TG32 may be vertically overlapped with the first-level third transfer gate electrode TG31. The first-level third transfer gate electrode TG31 may have a first width W1. The second-level third transfer gate electrode TG32 may have a second width W2. The first width W1 may be larger than the second width W2.

A second-level source electrode 21s and a second-level drain electrode 21d may be disposed on (over) the channel pattern CHL and may be spaced apart from the second-level third transfer gate electrode TG32. The third gate insulating layer 16 may be extended to include portions which are interposed between the channel pattern CHL and the second-level source electrode 21s, and between the channel pattern CHL and the second-level drain electrode 21d. The second-level source electrode 21s may be overlapped with the first-level source electrode 13s, when viewed in a plan view. The second-level drain electrode 21d may be overlapped with the first-level drain electrode 13d, when viewed in a plan view.

The second-level source electrode 21s, the second-level drain electrode 21d, and the second-level third transfer gate electrode TG32 may include metallic materials, which are different from the first-level source electrode 13s, the first-level drain electrode 13d, and the first-level third transfer gate electrode TG31. For example, the first-level source electrode 13s, the first-level drain electrode 13d, and the first-level third transfer gate electrode TG31 may include tungsten, whereas the second-level source electrode 21s, the second-level drain electrode 21d, and the second-level third transfer gate electrode TG32 may include copper.

Side and bottom surfaces of the second-level source electrode 21s, the second-level drain electrode 21d, and the second-level third transfer gate electrode TG32 may be covered with the second diffusion barrier layer 19. A first capping pattern 18s may be interposed between the second-level source electrode 21s and the third gate insulating layer 16. A second capping pattern 18g may be interposed between the second-level third transfer gate electrode TG32 and the third gate insulating layer 16. The second capping pattern 18g may have a third width W3. The third width W3 may be larger than the second width W2. A third capping pattern 18d may be interposed between the second-level drain electrode 21d and the third gate insulating layer 16. The first to third capping patterns 18s, 18g, and 18d may be spaced apart from each other and may have substantially the same thickness and substantially the same material. In an embodiment, the first to third capping patterns 18s, 18g, and 18d may be formed of or include at least one of metal nitride materials (e.g., titanium nitride).

In an embodiment, the first-level third transfer gate electrode TG31 and the second-level third transfer gate electrode TG32 may be electrically connected to each other through an additional via plug (not shown). Here, the first-level third transfer gate electrode TG31 and the second-level third transfer gate electrode TG32 may behave like a single transfer gate electrode (e.g., the third transfer gate electrode TG3 of FIG. 5C).

In an embodiment, only the second-level third transfer gate electrode TG32 may behave like the third transfer gate electrode TG3 of FIG. 5C, and the first-level third transfer gate electrode TG31 may be applied with no voltage and may be in an electrically floating state. In this case, the first-level third transfer gate electrode TG31 may serve as a light-blocking pattern, not as a gate electrode. Since the first width W1 is larger than the second width W2, it may be possible to prevent light, which is incident through the second surface 110b, from being incident into the channel pattern CHL located below the second-level third transfer gate electrode TG32. Thus, it may be possible to prevent a change in threshold voltage of the third transfer transistor Tx3 of FIG. 5C.

In certain embodiments, the first-level third transfer gate electrode TG31 and the second-level third transfer gate electrode TG32 may be applied with respective voltages and may be used to control motion of charges in the channel pattern CHL. In this case, the third transfer transistor Tx3 may be substantially the same as that of FIG. 8B. The first-level third transfer gate electrode TG31 or the second-level third transfer gate electrode TG32 may serve as a back-gate electrode. Furthermore, the second-level source electrode 21s and the second-level drain electrode 21d may also be applied with voltages. The second-level source electrode 21s and the second-level drain electrode 21d may be disposed on the third gate insulating layer 16 and may serve as an additional auxiliary gate electrode. In this case, motion of charges in the channel pattern CHL may be controlled by the first-level third transfer gate electrode TG31, the second-level third transfer gate electrode TG32, the second-level source electrode 21s, and the second-level drain electrode 21d. Other elements and their operations may be substantially the same as or similar to those described with reference to FIGS. 2, 3, 4A, 4B, 5A, and 5B, and are therefore omitted for brevity.

Figure 9A:
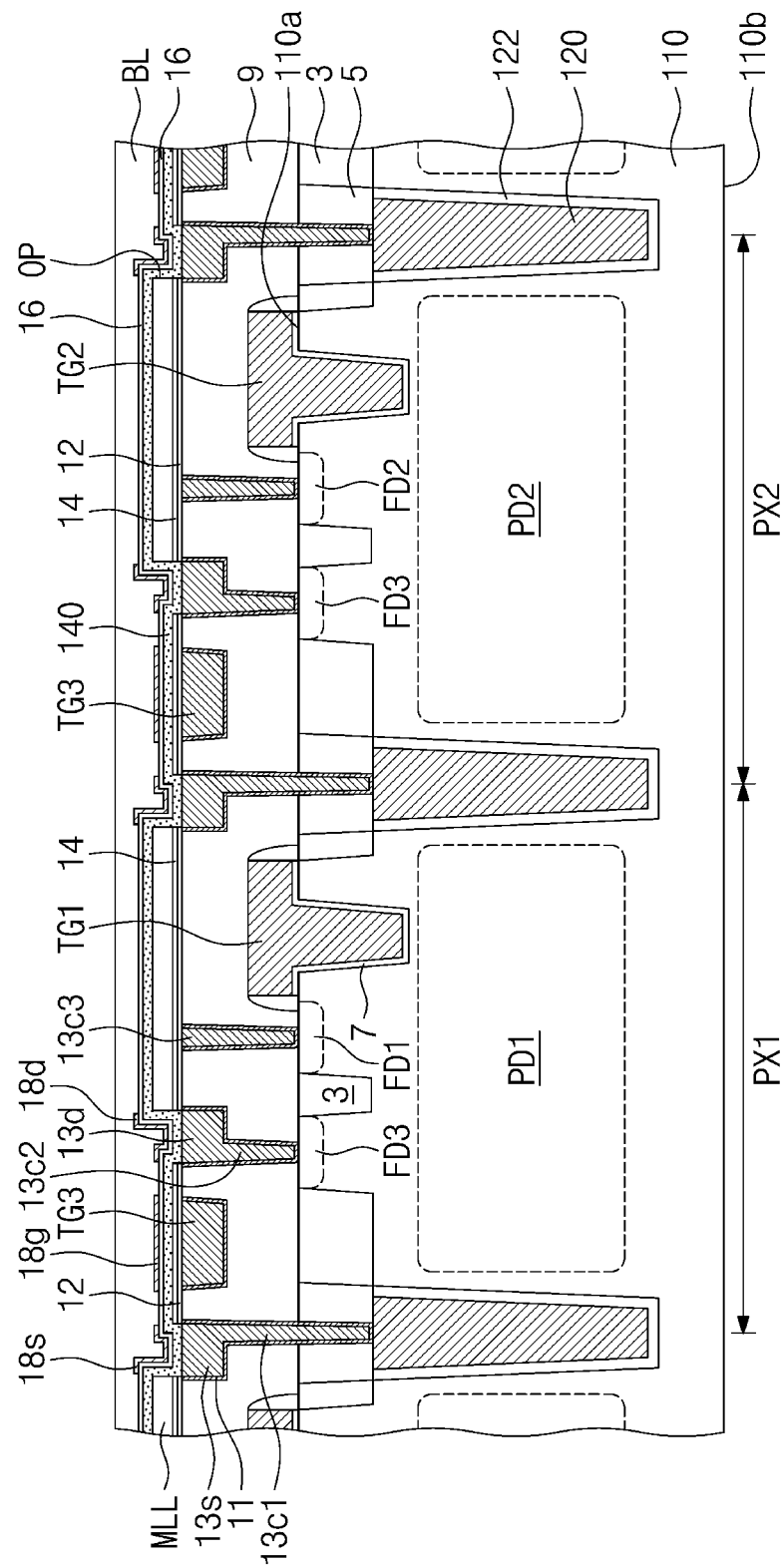
FIGS. 9A, 9B and 9C illustrate sectional views sequentially showing a process of fabricating the image sensor of FIG. 7.
Figure 9B:
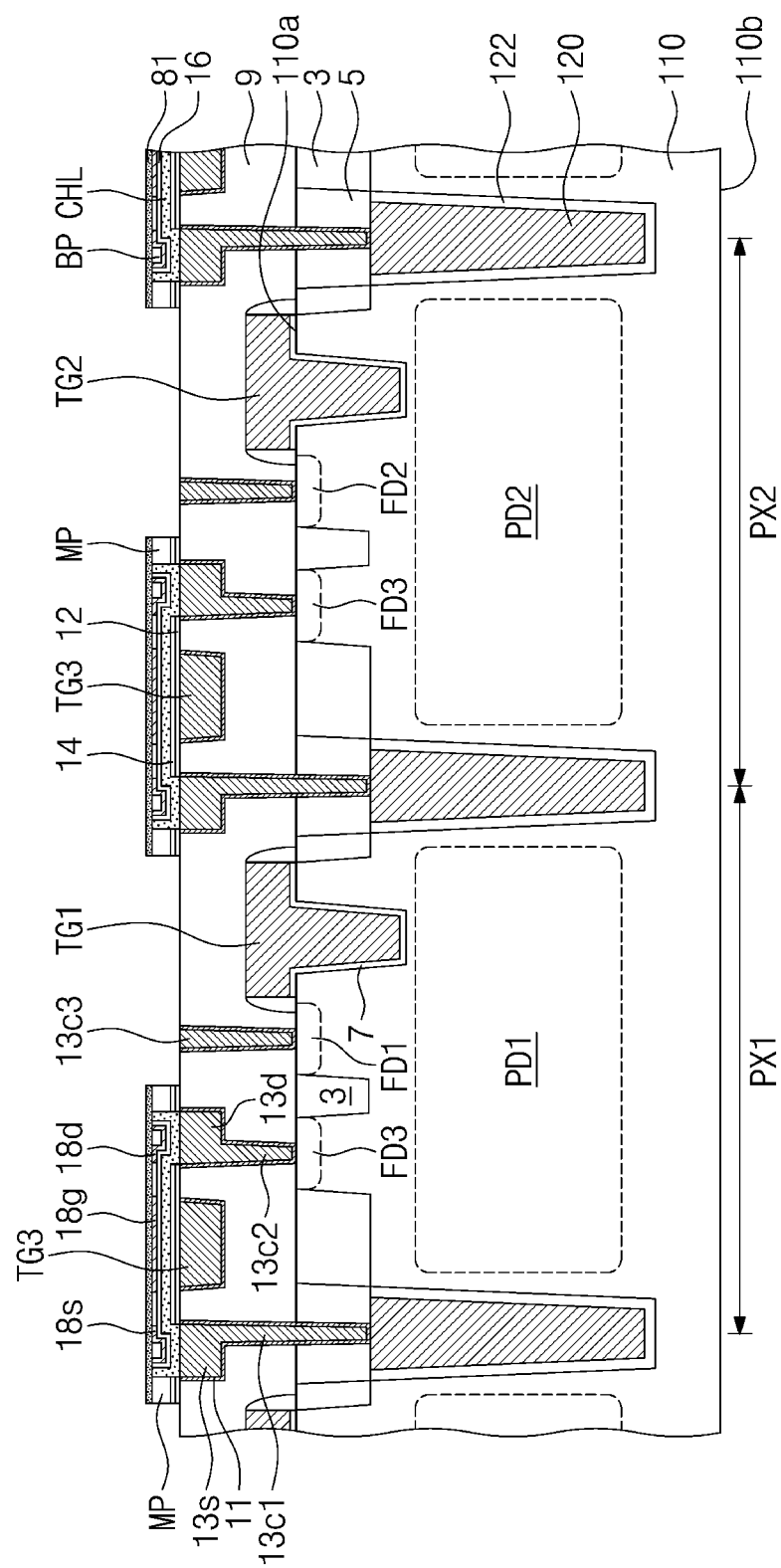
Figure 9C:
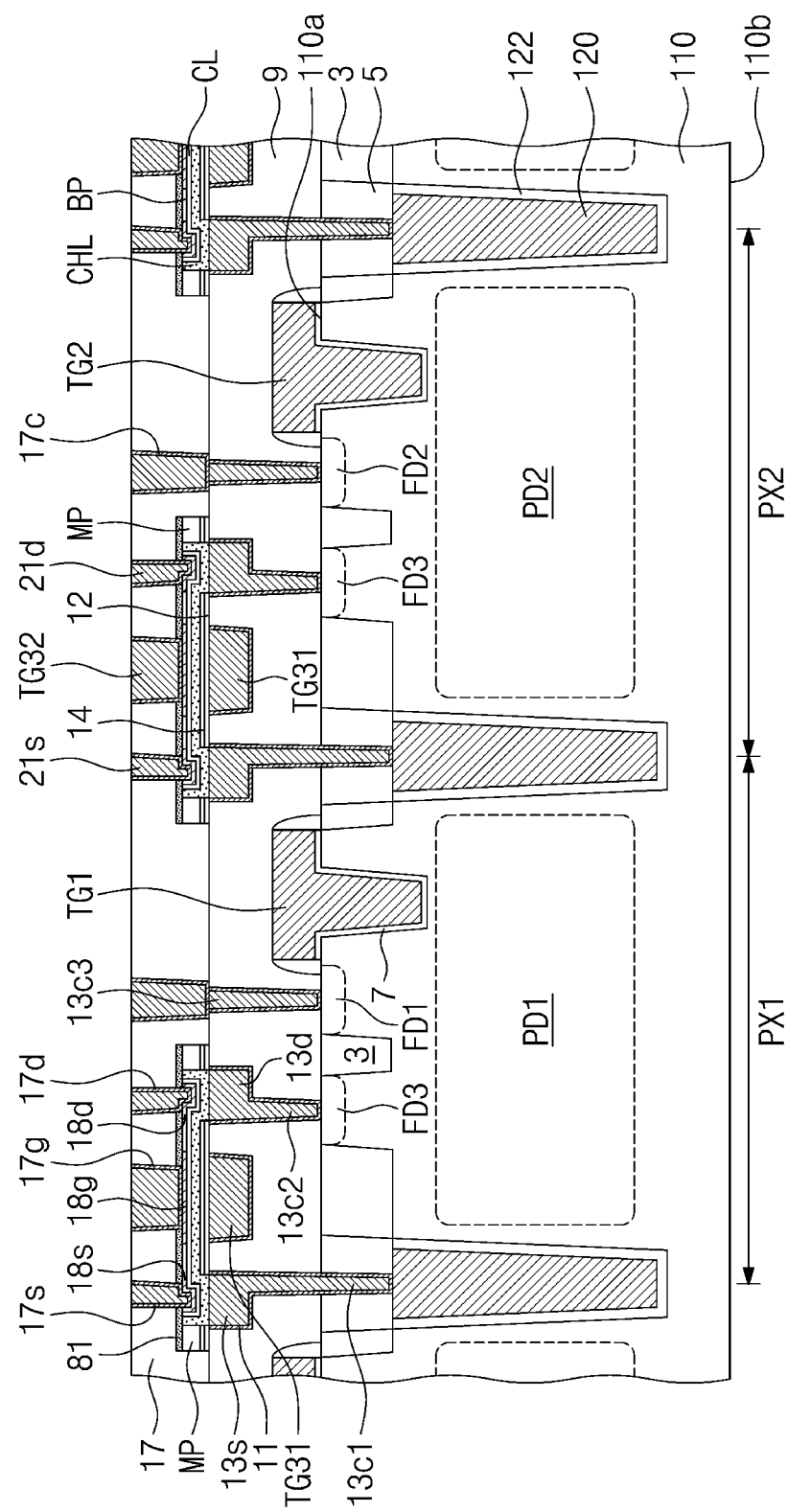

FIGS. 9A, 9B and 9C illustrate sectional views sequentially showing a process of fabricating the image sensor of FIG. 7.

Referring to FIG. 9A, the channel layer 140 may be formed on the resulting structure of FIG. 6D, and then, the third gate insulating layer 16 and a capping layer may be sequentially and conformally stacked on the channel layer 140. The capping layer may be formed of or include, for example, titanium nitride. The third gate insulating layer 16 may be formed of or include, for example, aluminum oxide or silicon oxide. A patterning process may be performed on the capping layer to form first to third capping patterns 18s, 18g, and 18d. Thereafter, the planarization layer BL may be formed to cover the structure including the first to third capping patterns 18s, 18g, and 18d.

Referring to FIG. 9B, the processes described with reference to FIGS. 6F and 6G may be performed. As a result, the channel pattern CHL, the upper insulating pattern 81, the planarization pattern BP, and the molding pattern MP may be formed. The planarization pattern BP is illustrated to fill a region between the first to third capping patterns 18s, 18g, and 18d, but in an embodiment, the planarization pattern BP may be extended into a region between the second capping pattern 18g and the upper insulating pattern 81.

Referring to FIG. 9C, the second interlayered insulating layer 17 may be stacked on the semiconductor substrate 110 and may be etched to form trenches, which expose the first to third capping patterns 18s, 18g, and 18d, respectively. In this etching process, the first to third capping patterns 18s, 18g, and 18d may serve as an etch stop layer, and thus, the third gate insulating layer 16 may be protected by the first to third capping patterns 18s, 18g, and 18d. Thereafter, the second diffusion barrier layer 19 may be conformally formed on the second interlayered insulating layer 17, a conductive layer may be stacked to fill the trench regions 17s, 17g, and 17d and a second-level contact hole 17c, and then, a polishing process may be performed to form the second-level source electrode 21s, the second-level-third transfer gate electrode TG32, the second-level drain electrode 21d, and the second-level contact plug 21c. Next, a subsequent process may be performed in the same or similar manner as described with reference to FIG. 6H and FIG. 3.

Figure 10:
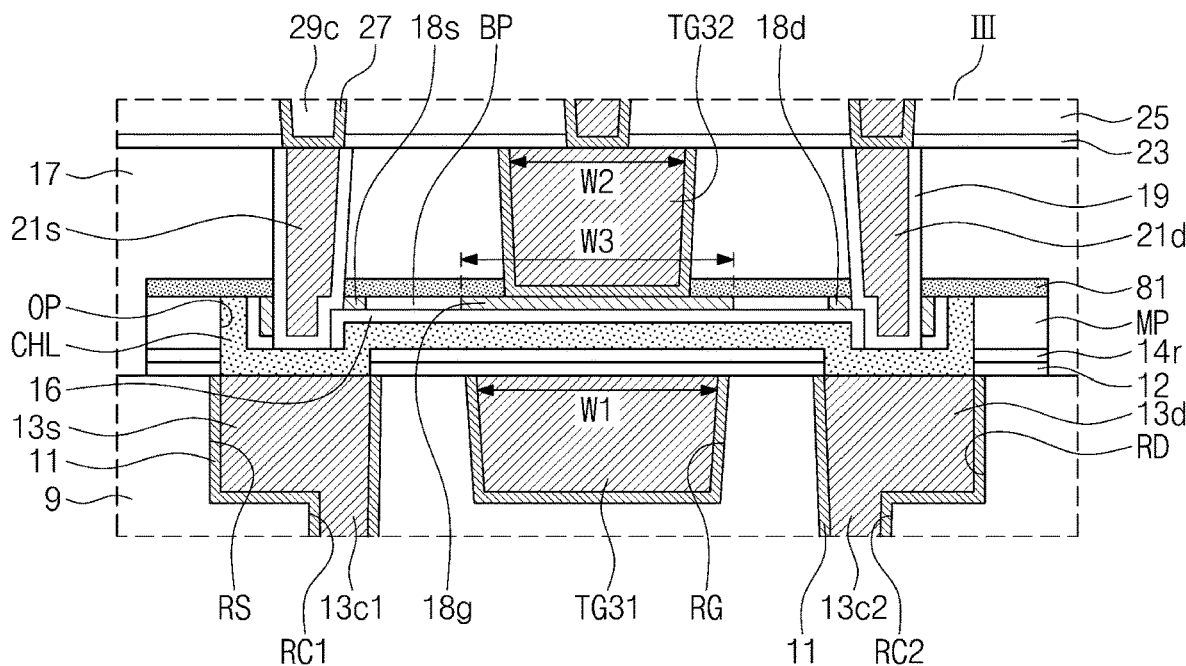
FIG. 10 illustrates an enlarged sectional view of a portion 'III' of FIG. 7, according to embodiments of the inventive concepts.
Figure 11:
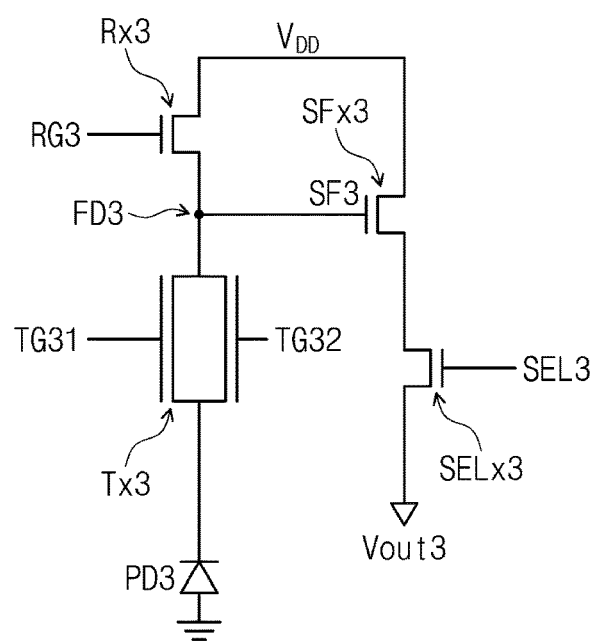
FIG. 11 illustrates a circuit diagram of the image sensor of FIG. 10.

FIG. 10 illustrates an enlarged sectional view of portion 'III' of FIG. 7, according to embodiments of the inventive concepts. FIG. 11 illustrates a circuit diagram of the image sensor of FIG. 10.

Referring to FIGS. 10 and 11, in the image sensor according to the present embodiment, the third gate insulating layer 16 is not interposed between the channel pattern CHL and the second-level source electrode 21s, and is not interposed between the channel pattern CHL and the second-level drain electrode 21d. Under the second-level source electrode 21s and under the second-level drain electrode 21d, the second diffusion barrier layer 19 may penetrate the first and third capping patterns 18s and 18d and the third gate insulating layer 16 and may be in direct contact with the channel pattern CHL. In other words, the second-level source electrode 21s and the second-level drain electrode 21d may be electrically connected to the channel pattern CHL. In this case, the second-level source electrode 21s and the second-level drain electrode 21d do not serve as auxiliary gate electrodes, in contrast to the previous embodiments of FIGS. 7, 8A and 8b. Motion of charges in the channel pattern CHL in the embodiment of FIG. 10 may thus be controlled by the first-level third transfer gate electrode TG31 and the second-level third transfer gate electrode TG32. Other elements and their operations may be substantially the same as or similar to those described with reference to FIGS. 2, 3, 4A, 4B, 5A, and 5B, and are therefore omitted for brevity.

Figure 12:
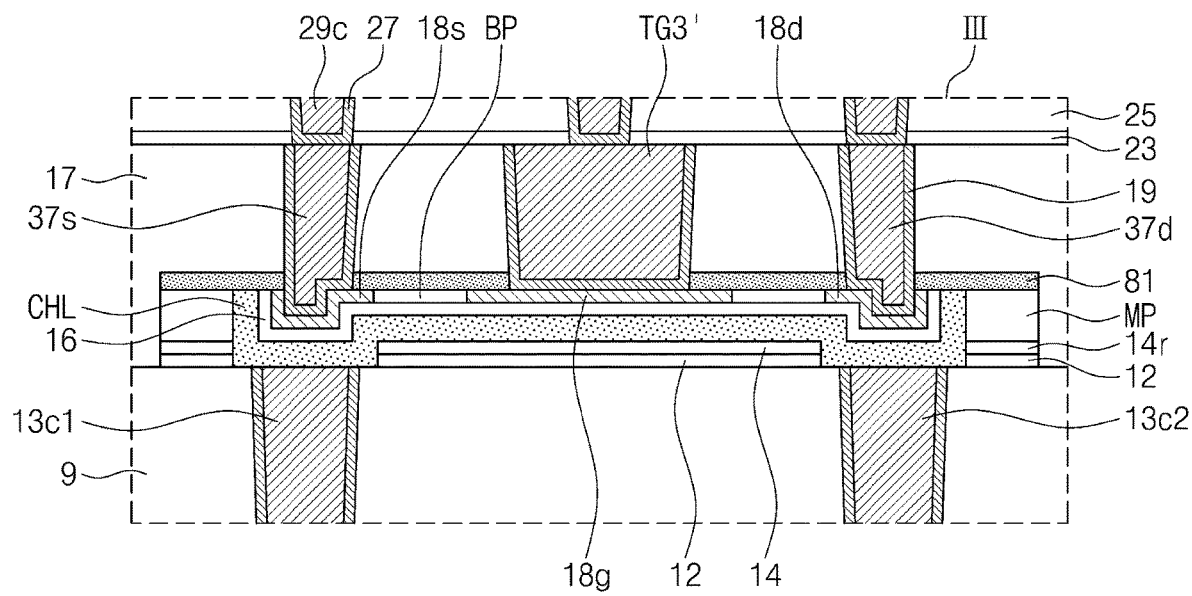
FIG. 12 illustrates an enlarged sectional view of a portion 'III' of FIG. 7, according to embodiments of the inventive concepts.
Figure 13:
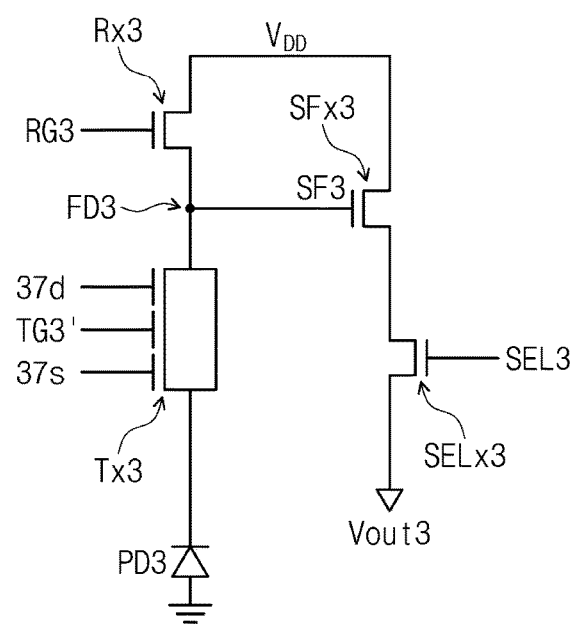
FIG. 13 illustrates a circuit diagram of the image sensor of FIG. 12.

FIG. 12 illustrates an enlarged sectional view of portion 'III' of FIG. 7, according to embodiments of the inventive concepts. FIG. 13 illustrates a circuit diagram of the image sensor of FIG. 12.

Referring to FIGS. 12 and 13, in the image sensor according to the present embodiment of the inventive concepts, a third transfer gate electrode TG3', a source electrode 37s, and a drain electrode 37d are disposed in the second interlayered insulating layer 17. In contrast to the previous embodiments of FIGS. 4, 8A, and 10, the third transfer gate electrode TG3' is provided in the second interlayered insulating layer 17. In certain embodiments, the third transfer gate electrode TG3', the source electrode 37s, and the drain electrode 37d may be disposed in the third interlayered insulating layer 25 or the fourth interlayered insulating layer 33. In the present embodiments, the first-level contact plugs 13c1, 13c2, and 13c3 may be formed of or include, for example, tungsten. All of the third transfer gate electrode TG3', the drain electrode 37d, and the source electrode 37s may be formed of or include copper.

The source electrode 37s and the drain electrode 37d may serve as auxiliary gate electrodes. For example, motion of charges in the channel pattern CHL of the third transfer transistor Tx3 may be controlled by the source electrode 37s, the third transfer gate electrode TG3', and the drain electrode 37d. Other elements and their operations may be substantially the same as or similar to those described with reference to FIGS. 2, 3, 4A, 4B, 5A, and 5B, and are therefore omitted for brevity.

Figure 14:
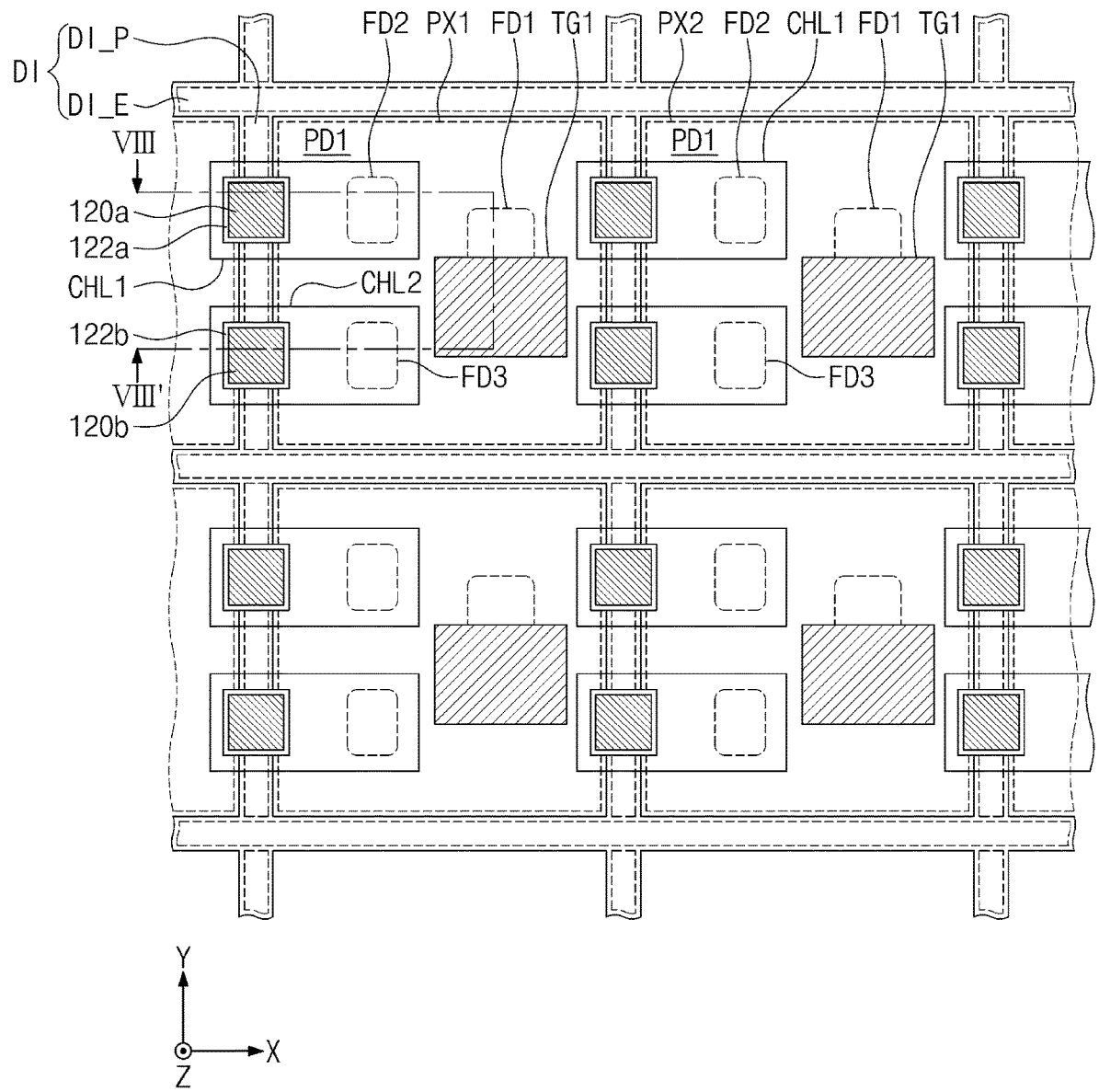
FIG. 14 illustrates a plan view of an image sensor according to embodiments of the inventive concepts.
Figure 15:
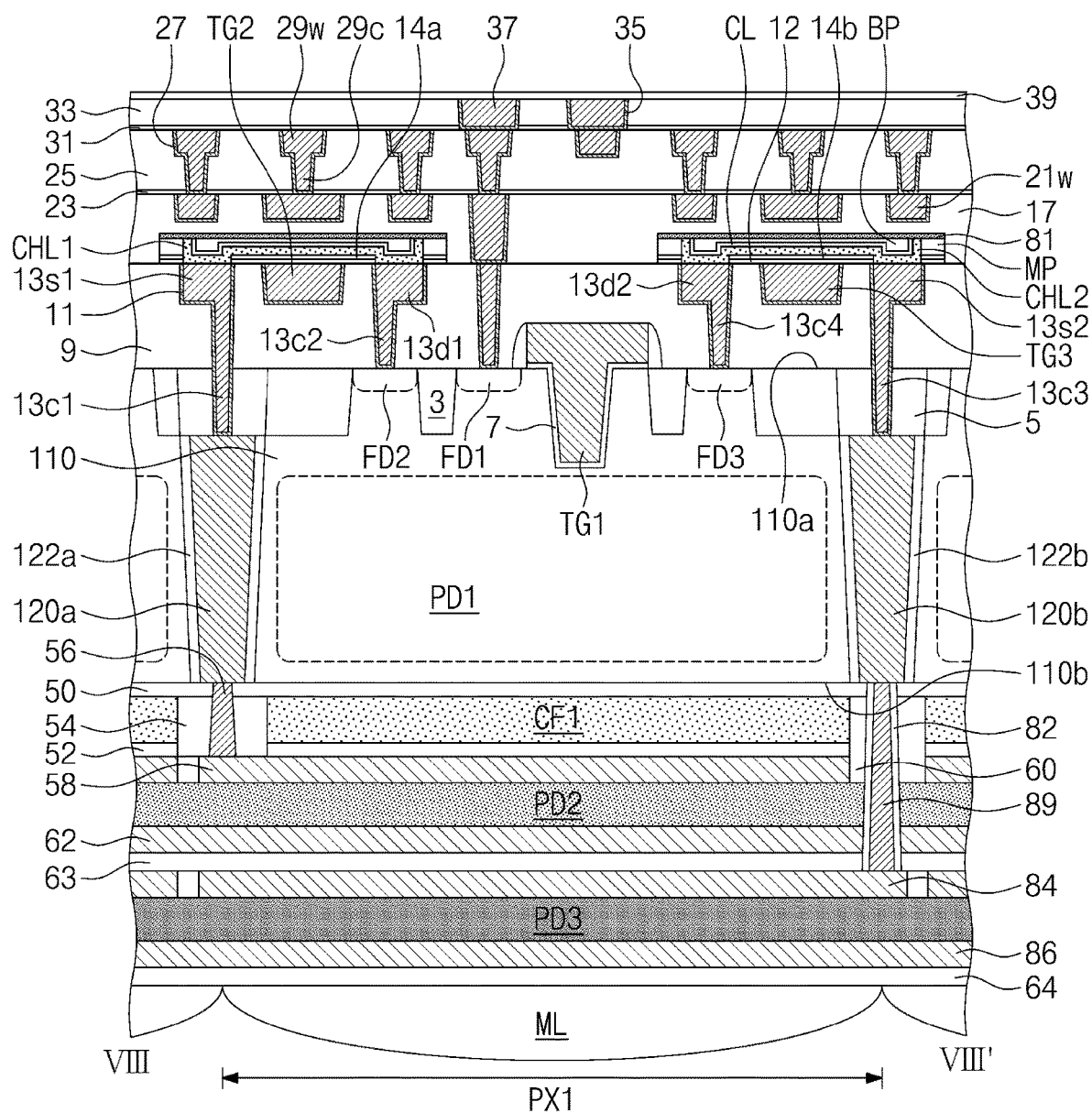
FIG. 15 illustrates a sectional view taken along a line VIII-VIII' of FIG. 14.

FIG. 14 illustrates a plan view of an image sensor according to embodiments of the inventive concepts. FIG. 15 illustrates a sectional view taken along a line VIII-VIII' of FIG. 14.

Referring to FIGS. 14 and 15, in the image sensor according to the present embodiment, each pixel PX1 or PX2 may be configured to obtain information on three different colors at the same time. In each pixel PX1 or PX2, the first photoelectric conversion part PD1 may be disposed in the semiconductor substrate 110. The first photoelectric conversion part PD1 may be, for example, an impurity region doped with n-type impurities. A first through electrode 120a and a second through electrode 120b, which are spaced apart from each other, may be disposed in the semiconductor substrate 110. A first via insulating layer 122a may be interposed between the first through electrode 120a and the semiconductor substrate 110. A second via insulating layer 122b may be interposed between the second through electrode 120b and the semiconductor substrate 110.

The protection layer 50, the first color filter CF1, the second insulating pattern 52, a first pixel electrode 58, the second photoelectric conversion part PD2, a first common electrode 62, a third insulating pattern 63, a second pixel electrode 84, the third photoelectric conversion part PD3, a second common electrode 86, the second passivation layer 64, and the micro lens ML may be sequentially stacked on the second surface 110b of the semiconductor substrate 110. The first insulating pattern 54 may be disposed between the first color filters CF1. The first through electrode 120a may be electrically connected to the first pixel electrode 58 through the first via plug 56, which is formed to penetrate the first insulating pattern 54 and the protection layer 50. The second through electrode 120b may be electrically connected to the second pixel electrode 84 through a second via plug 89. A side surface of the second via plug 89 may be covered with a third via insulating layer 82.

All of the first and second pixel electrodes 58 and 84 and the first and second common electrodes 62 and 86 may include indium-tin oxide (ITO), indium-zinc oxide (IZO), zinc oxide (ZnO), and/or organic transparent conductive materials. The second and third photoelectric conversion parts PD2 and PD3 may sense only light of a specific wavelength and generate charges, even when lights of various wavelengths are incident thereto. In an embodiment, the second and third photoelectric conversion parts PD2 and PD3 may be organic photoelectric conversion layers and may contain a p-type organic semiconductor material and an n-type organic semiconductor material, respectively, or may contain quantum dots or chalcogenide materials.

In each pixel PX1 or PX2, the second floating diffusion region FD2 and the third floating diffusion region FD3, which are spaced apart from the first floating diffusion region FD1, may be disposed in the first surface 110a of the semiconductor substrate 110. A first source electrode 13s1, a second transfer gate electrode TG2, and a first drain electrode 13d1, which are spaced apart from each other, may be disposed in the first interlayered insulating layer 9. In addition, a second source electrode 13s2, the third transfer gate electrode TG3, and a second drain electrode 13d2, which are spaced apart from each other, may be disposed in the first interlayered insulating layer 9. A second gate insulating layer 14a and a first channel pattern CHL1 may be sequentially stacked on the second transfer gate electrode TG2. The first channel pattern CHL1 is laterally extended to be in contact with the first source electrode 13s1 and the first drain electrode 13d1. A third gate insulating layer 14b and a second channel pattern CHL2 may be sequentially disposed on the third transfer gate electrode TG3. The second channel pattern CHL2 is laterally extended to be in contact with the second source electrode 13s2 and the second drain electrode 13d2.

The first photoelectric conversion part PD1 may be configured to generate charges from (responsive to) a light of a first wavelength passing through the first color filter CF1. Such charges may be transferred to the first floating diffusion region FD1 by the first transfer gate electrode TG1.

The second photoelectric conversion part PD2 may be configured to generate charges from (responsive to) a light of a second wavelength. Such charges may be transferred to the first channel pattern CHL1 through the first pixel electrode 58, the first via plug 56, the first through electrode 120a, the first-level first contact plug 13c1, and the first source electrode 13s1, and may be transferred to the second floating diffusion region FD2 through the first drain electrode 13d1 and the first-level second contact plug 13c2, when the second transfer gate electrode TG2 is applied with a voltage.

The third photoelectric conversion part PD3 may be configured to generate charges from (responsive to) a light of a third wavelength. Such charges may be transferred to the second channel pattern CHL2 through the second pixel electrode 84, the second via plug 89, the second through electrode 120b, the first-level third contact plug 13c3, and the second source electrode 13s2, and may be transferred to the third floating diffusion region FD3 through the second drain electrode 13d2 and a first-level fourth contact plug 13c4, when the third transfer gate electrode TG3 is applied with a voltage. Other elements and their operations may be substantially the same as or similar to those described with reference to FIGS. 2, 3, 4A, 4B, 5A, and 5B, and are therefore omitted for brevity.

Figure 16:
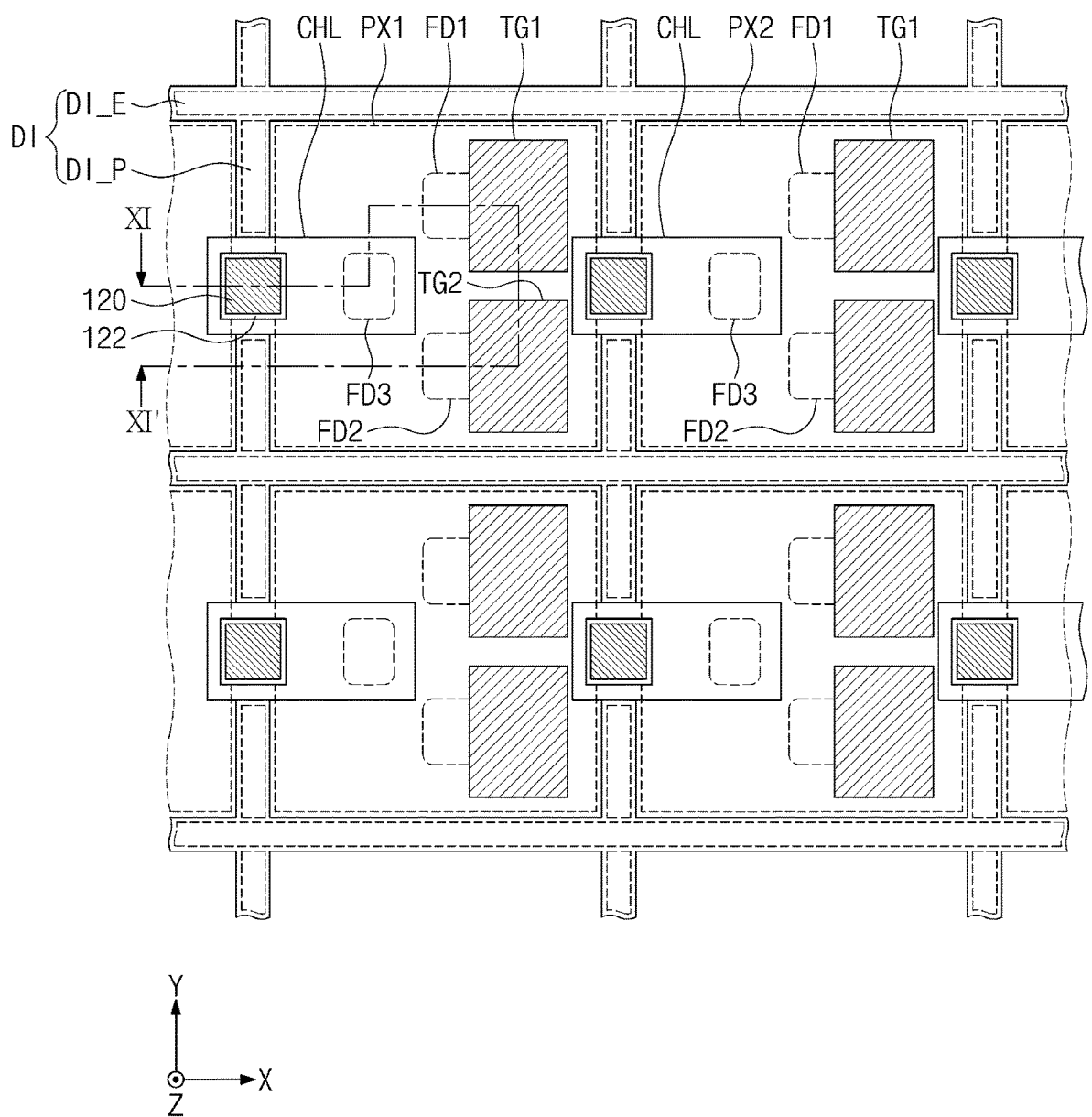
FIG. 16 illustrates a plan view of an image sensor according to embodiments of the inventive concepts.
Figure 17:
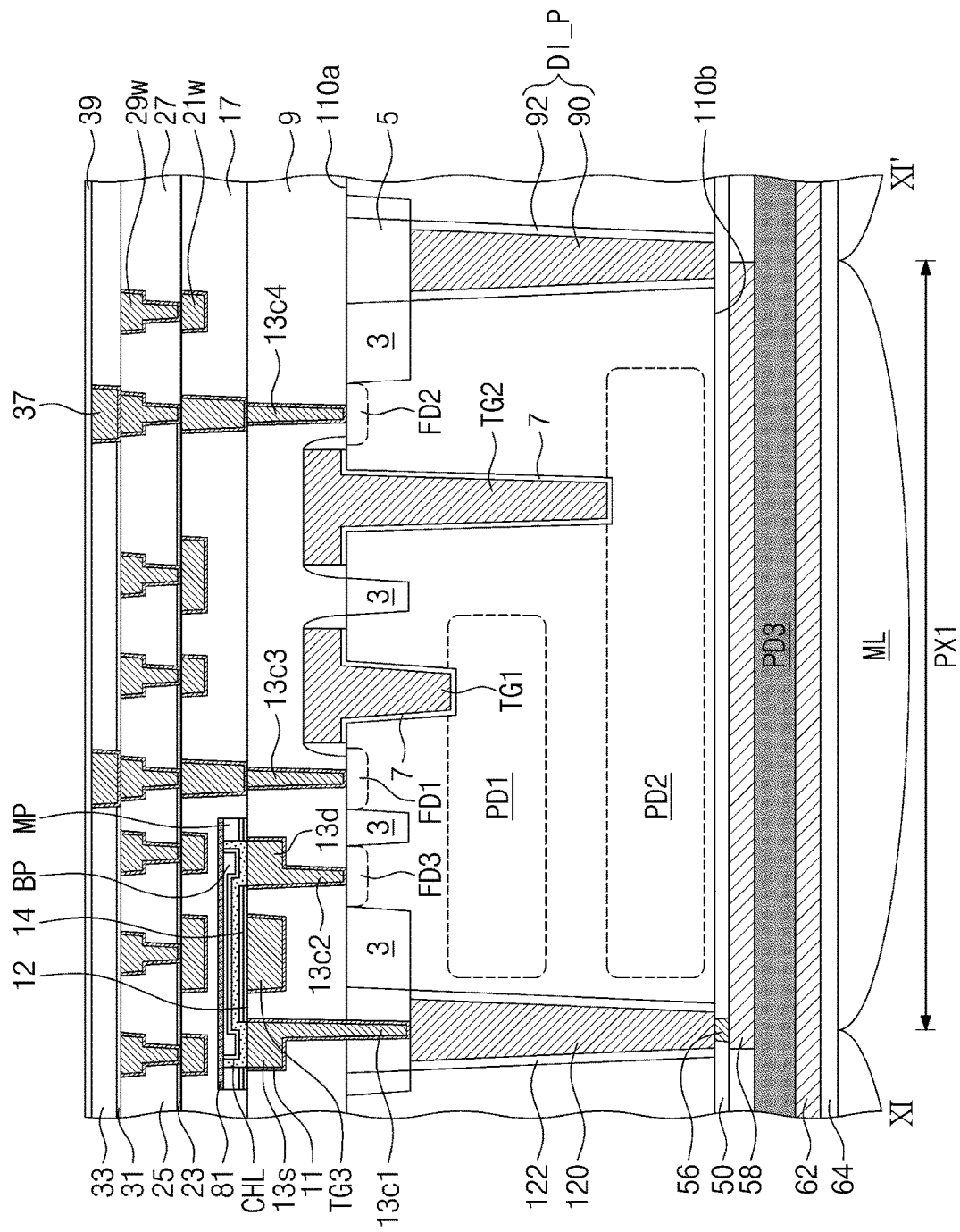
FIG. 17 illustrates a sectional view taken along a line XI-XI' of FIG. 16.

FIG. 16 illustrates a plan view of an image sensor according to embodiments of the inventive concepts. FIG. 17 illustrates a sectional view taken along a line XI-XI' of FIG. 16.

Referring to FIGS. 16 and 17, in the image sensor according to the present embodiment, each pixel PX1 or PX2 may be configured to obtain information on three different colors at the same time. In each pixel PX1 or PX2, the first photoelectric conversion part PD1 and the second photoelectric conversion part PD2 may be disposed at different depths in the semiconductor substrate 110 and may be vertically spaced apart from each other. The first and second photoelectric conversion parts PD1 and PD2 may be, for example, impurity regions that are doped with n-type impurities. The deep device isolation part DI may be disposed in the semiconductor substrate 110 to separate the first pixel PX1 and the second pixel PX2 from each other. The deep device isolation part DI may include a polysilicon pattern 90 and an insulating pattern 92. In each pixel PX1 or PX2, the first transfer gate electrode TG1 and the second transfer gate electrode TG2, which are spaced apart from each other, may be disposed on the first surface 110a of the semiconductor substrate 110. A portion of the first transfer gate electrode TG1 may be extended into the semiconductor substrate 110 and may be located adjacent to the first photoelectric conversion part PD1. A portion of the second transfer gate electrode TG2 may be extended into the semiconductor substrate 110 and may be located adjacent to the second photoelectric conversion part PD2. The second photoelectric conversion part PD2 may be deeper than the first photoelectric conversion part PD1, and a bottom surface of the second transfer gate electrode TG2 may be deeper than a bottom surface of the first transfer gate electrode TG1. The first floating diffusion region FD1 may be disposed in a region of the semiconductor substrate 110 adjacent to the first transfer gate electrode TG1. The second floating diffusion region FD2 may be disposed in a region of the semiconductor substrate 110 adjacent to the second transfer gate electrode TG2. The third floating diffusion region FD3, which is spaced apart from the first and second floating diffusion regions FD1 and FD2, may be disposed in the first surface 110a of the semiconductor substrate 110.

In each pixel PX1 or PX2, a color filter is not disposed on the second surface 110b of the semiconductor substrate 110. The protection layer 50, the pixel electrode 58, the third photoelectric conversion part PD3, the common electrode 62, the second passivation layer 64, and the micro lens ML may be sequentially disposed on the second surface 110b of the semiconductor substrate 110.

The first photoelectric conversion part PD1 may be configured to generate charges from (responsive to) a light of a first wavelength. Such charges may be transferred to the first floating diffusion region FD1 by the first transfer gate electrode TG1. The second photoelectric conversion part PD2 may be configured to generate charges from (responsive to) a light of a second wavelength. Such charges may be transferred to the second floating diffusion region FD2 by the second transfer gate electrode TG2. Due to a difference in wavelength therebetween, the lights of the first and second wavelengths may have different penetration depths into the semiconductor substrate 110. Thus, even though there is no color filter, the first photoelectric conversion part PD1 and the second photoelectric conversion part PD2 may sense lights of different wavelengths. The third photoelectric conversion part PD3 may be configured to generate charges from (responsive to) a light of a third wavelength. Such charges may be transferred to the third floating diffusion region FD3 by the third transfer gate electrode TG3. Other elements and their operations may be substantially the same as or similar to those described with reference to FIGS. 2, 3, 4A, 4B, 5A, and 5B, and are therefore omitted for brevity.

Figure 18:
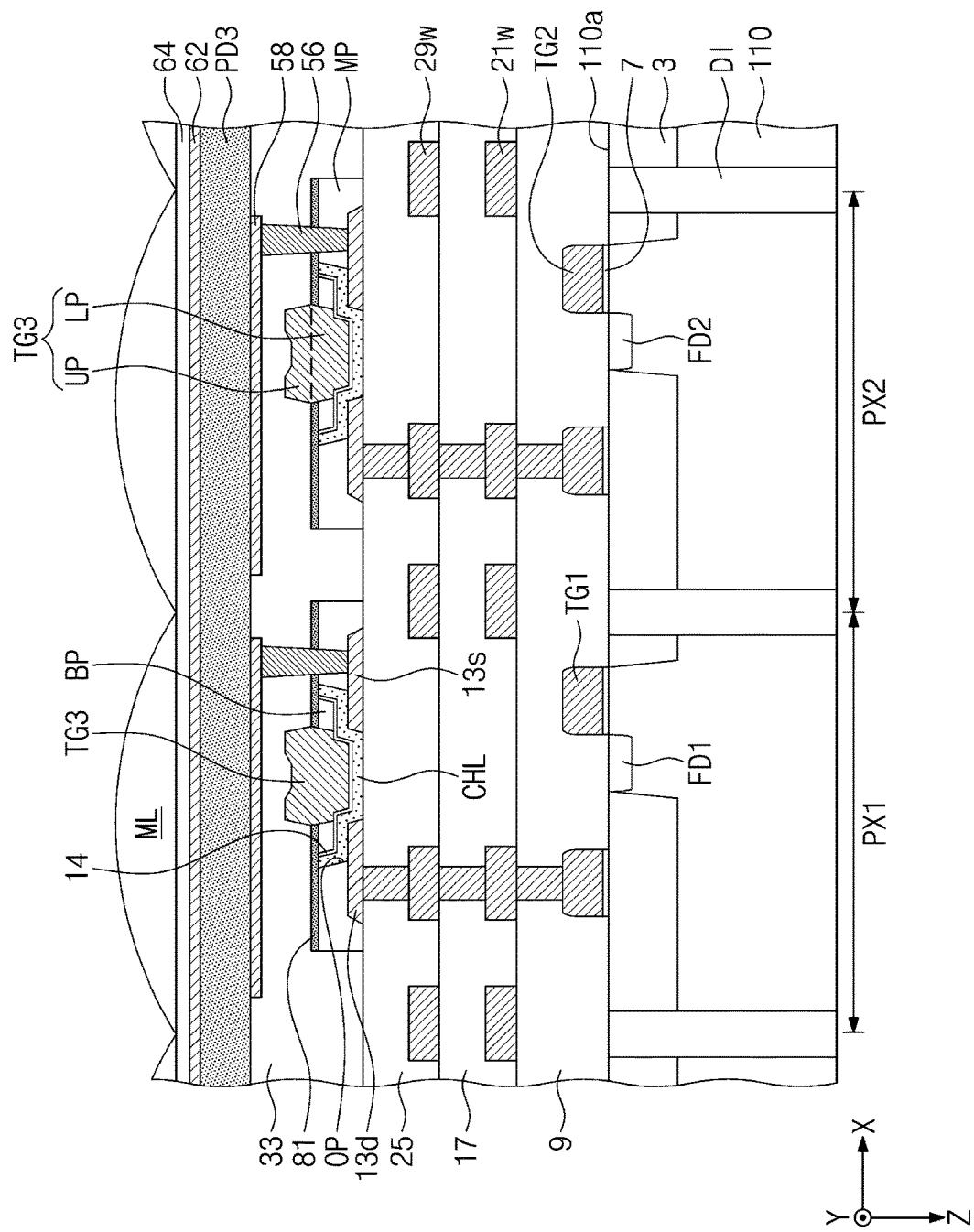
FIG. 18 illustrates a sectional view of an image sensor according to embodiments of the inventive concepts.

FIG. 18 illustrates a sectional view of an image sensor according to embodiments of the inventive concepts. The image sensor according to the present embodiment may be a front-side light-receiving image sensor, in which the interconnection layers are disposed between the semiconductor substrate 110 and the micro lens ML. In other words, the second-level lines 21w and the third-level lines 29w may be sequentially disposed on the first surface 110a of the semiconductor substrate 110 including the first and second photoelectric conversion parts, and the micro lenses ML may be disposed over the third-level lines 29w.

The third transfer transistors Tx3, which include third transfer gate electrodes TG3, may be provided between the micro lenses ML and the third-level lines 29w. As an example, the molding pattern MP may be provided in the fourth interlayered insulating layer 33. The molding pattern MP may include the opening OP and may cover the source and drain electrodes 13s and 13d. The opening OP may partly expose the source and drain electrodes 13s and 13d. The channel pattern CHL and the second gate insulating layer 14 may be sequentially provided to cover the source and drain electrodes 13s and 13d, which are exposed through the opening OP. The channel pattern CHL may be formed of or include an oxide semiconductor material. The third transfer gate electrode TG3 may be provided on the second gate insulating layer 14. The remaining portion of the opening OP may be filled with the planarization pattern BP. The upper insulating pattern 81 may be provided to cover the planarization pattern BP and the molding pattern MP.

The third transfer gate electrode TG3 may include a lower portion LP and an upper portion UP. The lower portion LP of the third transfer gate electrode TG3 may be provided to penetrate the upper insulating pattern 81 and the planarization pattern BP. The upper portion UP of the third transfer gate electrode TG3 may be a portion protruding from the top surface of the upper insulating pattern 81. A side surface of the lower portion LP and a side surface of the upper portion UP may be inclined at different angles from each other. As an example, the lower portion LP may have a decreasing width in a downward direction, and the upper portion UP may have a decreasing width in an upward direction. The lower portion LP may have an inclination angle which is determined by a side surface of the recess region formed in the planarization pattern BP, while the upper portion UP may have an inclination angle which is determined by a side surface formed by an etching process.

The third photoelectric conversion part PD3 may be disposed between the third transfer gate electrodes TG3 and the micro lenses ML. The third photoelectric conversion part PD3 may be, for example, an organic photoelectric conversion layer. Each of the pixel electrodes 58 may be disposed below the third photoelectric conversion part PD3, and the common electrode 62 may be disposed on the third photoelectric conversion part PD3. The pixel electrodes 58 may be connected to the source electrode 13s through the first via plugs 56. As shown, color filters are not provided in this embodiment, but in other embodiments the color filters may be provided between the third photoelectric conversion part PD3 and the micro lenses ML, or between the third photoelectric conversion part PD3 and the fourth interlayered insulating layer 33.

In a method of fabricating an image sensor according to embodiments of the inventive concepts, a channel pattern including an oxide semiconductor material may be formed by a damascene process. Accordingly, it may be possible to reduce a size of a transistor and to suppress a contamination by an oxide semiconductor material.

According to embodiments of the inventive concepts, an image sensor may include a separate transfer transistor, which is formed on an interlayered insulating layer and used to transfer charges generated in an organic photoelectric conversion part. Thus, it may be possible to reduce reset noise and to increase charge transfer speed. In addition, it may be possible to provide a highly integrated image sensor capable of realizing improved image quality.

In a method of fabricating an image sensor according to embodiments of the inventive concepts, before a back-end-of-line (BEOL) process, a channel pattern may be formed using an oxide semiconductor material, and thus, it may be possible to reduce or prevent contamination issues caused by the oxide semiconductor material, and the consequent process failure, during the BEOL process.

While example embodiments of the inventive concepts have been particularly shown and described, it should be understood by one of ordinary skill in the art that variations in form and detail may be made therein without departing from the spirit and scope of the inventive concepts.

What is claimed is:

1. An image sensor, comprising:
   a semiconductor substrate including a first floating diffusion region;
   a molding pattern over the first floating diffusion region and including an opening;
   a first photoelectric conversion part at a surface of the semiconductor substrate; and
   a first transfer transistor connecting the first photoelectric conversion part to the first floating diffusion region,
   wherein the first transfer transistor comprises a channel pattern in the opening and a first transfer gate electrode, the channel pattern comprising an oxide semiconductor,
   the channel pattern comprises a sidewall portion that covers a side surface of the opening, and a center portion that extends from the sidewall portion to a region over the first transfer gate electrode, and the channel pattern and the first photoelectric conversion part are spaced apart from each other, with the semiconductor substrate interposed therebetween.

2. The image sensor of claim 1, wherein a top surface of the molding pattern and a top surface of the sidewall portion are coplanar.

3. The image sensor of claim 1, wherein the sidewall portion has a ring shape extending along an edge of the center portion.

4. The image sensor of claim 1, further comprising a planarization pattern in the opening and that covers the center portion.

5. The image sensor of claim 4, wherein a top surface of the planarization pattern, a top surface of the molding pattern, and a top surface of the sidewall portion are coplanar.

6. The image sensor of claim 4, further comprising an upper insulating pattern covering the planarization pattern, the molding pattern, and the sidewall portion,
   wherein a side surface of the upper insulating pattern is aligned with an outer side surface of the molding pattern.

7. The image sensor of claim 1, further comprising a first gate insulating layer in the opening and below the center portion,
   wherein the first transfer gate electrode is provided below the first gate insulating layer.

8. The image sensor of claim 1, further comprising:
   a first gate insulating layer extending along a top surface of the channel pattern; and
   a second transfer gate electrode on the first gate insulating layer.

9. The image sensor of claim 1, wherein the first photoelectric conversion part comprises an organic semiconductor material.

10. The image sensor of claim 1, further comprising a through electrode disposed in the semiconductor substrate and that connects the first photoelectric conversion part to the first transfer transistor.

11. The image sensor of claim 10, further comprising:
    a first contact plug connecting the through electrode to a first end of the channel pattern; and
    a second contact plug connecting the first floating diffusion region to a second end of the channel pattern that is opposite the first end.

12. The image sensor of claim 11, further comprising:
    a first conductive pattern spaced apart from the first contact plug with the channel pattern interposed therebetween; and
    a second conductive pattern spaced apart from the second contact plug with the channel pattern interposed therebetween.

13. The image sensor of claim 1, further comprising:
    a second photoelectric conversion part disposed in the semiconductor substrate;
    a second floating diffusion region disposed in an upper portion of the semiconductor substrate; and
    a second transfer transistor connecting the second photoelectric conversion part to the second floating diffusion region.

14. An image sensor, comprising:
    a semiconductor substrate including a floating diffusion region;
    a photoelectric conversion part on the semiconductor substrate;
    a molding pattern on the semiconductor substrate and including a hole therethrough; and
    a transfer transistor connecting the photoelectric conversion part to the floating diffusion region, the transfer transistor comprising
        a channel pattern in the hole, the channel pattern including a sidewall portion on a side surface of the molding pattern in the hole, and a center portion extending within the hole from the sidewall portion to a region over the semiconductor substrate,
        wherein a top surface of the sidewall portion of the channel pattern is positioned at a same level as a top surface of the molding pattern, and the top surface of the sidewall portion is positioned above a level of a top surface of the center portion,
        a planarization pattern filling the hole over the channel pattern, wherein a top surface of the planarization pattern is coplanar with the top surface of the sidewall portion of the channel pattern,
        a gate insulating layer on the channel pattern in the hole, and
        a gate electrode spaced apart from the channel pattern with the gate insulating layer interposed therebetween.

15. The image sensor of claim 14, wherein the channel pattern and the planarization pattern are locally disposed in the hole of the molding pattern.

16. The image sensor of claim 14, further comprising an interlayered insulating layer defining a bottom surface of the hole.

17. The image sensor of claim 16, wherein the channel pattern has a conformal shape extending along the side surface of the molding pattern and the bottom surface of the hole.

18. The image sensor of claim 16, wherein the sidewall portion has a ring shape extending along an edge of the center portion.

19. An image sensor, comprising:
    a semiconductor substrate including a first surface and a second surface opposite the first surface;
    a first floating diffusion region and a second floating diffusion region disposed on the first surface of the semiconductor substrate;
    a first photoelectric conversion part on the second surface;
    a second photoelectric conversion part disposed in the semiconductor substrate;
    a molding pattern on the first surface and including an opening;
    a planarization pattern in the opening; and
    a first transfer transistor electrically connecting the first photoelectric conversion part to the first floating diffusion region,
    wherein the first transfer transistor comprises a channel pattern and a first transfer gate electrode, the channel pattern comprising an oxide semiconductor, and
    the channel pattern comprises a sidewall portion that covers a side surface of the opening, and a center portion that extends from the sidewall portion to a region on the first transfer gate electrode.

* * * * *